(12) United States Patent
Hong et al.

(10) Patent No.: US 12,223,129 B2
(45) Date of Patent: Feb. 11, 2025

(54) DISPLAY DEVICE

(71) Applicant: SAMSUNG DISPLAY CO., LTD., Yongin-si (KR)

(72) Inventors: Soo Yeong Hong, Yongin-si (KR); Gee Bum Kim, Yongin-si (KR); Sang Woo Kim, Yongin-si (KR); Kwang Soo Bae, Yongin-si (KR); Bo Kwang Song, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 62 days.

(21) Appl. No.: 18/210,117

(22) Filed: Jun. 15, 2023

(65) Prior Publication Data

US 2024/0134471 A1 Apr. 25, 2024
US 2024/0231518 A9 Jul. 11, 2024

(30) Foreign Application Priority Data

Oct. 20, 2022 (KR) .......................... 10-2022-0135366

(51) Int. Cl.
*G06F 3/041* (2006.01)
*G09G 3/32* (2016.01)

(52) U.S. Cl.
CPC ............. *G06F 3/0412* (2013.01); *G09G 3/32* (2013.01)

(58) Field of Classification Search
CPC ........ H10K 59/40; G09G 3/32; G06F 3/0412; G06F 3/0443; G06F 3/0446; G06F 2203/04112
See application file for complete search history.

(56) References Cited

U.S. PATENT DOCUMENTS

2018/0246369 A1  8/2018 Huang
2020/0104563 A1* 4/2020 Ryu ..................... G02B 6/0053

FOREIGN PATENT DOCUMENTS

CN     112117357    12/2020
CN     113130613     7/2021

* cited by examiner

*Primary Examiner* — Deeprose Subedi
(74) *Attorney, Agent, or Firm* — F. CHAU & ASSOCIATES, LLC

(57) ABSTRACT

A device comprises a substrate, a plurality of emission portions disposed on the substrate and emitting light, a plurality of light sensing portions disposed on the substrate and sensing an incident light, a bank layer partitioning the plurality of emission portions and the plurality of light sensing portions, and a touch sensing layer disposed on the bank layer. The touch sensing layer comprises a first touch insulating pattern disposed on the bank layer and partitioning a light opening overlapping the plurality of light sensing portions and a touch electrode disposed on the first touch insulating pattern. A cross-sectional shape of the first touch insulating pattern has a reverse tapered shape having a width that decreases towards a top surface of the substrate.

20 Claims, 20 Drawing Sheets

DISPLAY DEVICE

CROSS-REFERENCE TO RELATED APPLICATION

This application claims priority under 35 U.S.C. § 119 to Korean Patent Application No. 10-2022-0135366, filed on Oct. 20, 2022 in the Korean Intellectual Property Office, the disclosure of which is incorporated by reference in its entirety herein.

1. TECHNICAL FIELD

The present disclosure relates to a display device.

2. DISCUSSION OF RELATED ART

The importance of display devices has steadily increased with the development of multimedia technology. Accordingly, various types of display devices such as a liquid crystal display (LCD) device, an organic light emitting display (OLED) device and the like have been developed.

Among the display devices, the organic light emitting display device is a self emitting device which displays an image using an organic light emitting diode (OLED) that generates light by recombination of electrons and holes. Such an organic light emitting display device provides an increased response speed, a large luminance, a large viewing angle, and relatively low power consumption.

Research and development on a technology for integrating sensors for touch recognition or fingerprint recognition to a display panel is being conducted. In these types of display panels, the width of a light opening needs to be reduced in order to increase the efficiency of light traveling to an optical sensor for fingerprint recognition.

SUMMARY

Embodiments of the present disclosure provide a display device capable of reflecting light incident through a light opening toward a light sensing portion, thereby detecting the incident light to accurately identify a user's fingerprint.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description of the present disclosure given below.

According to an embodiment of the present disclosure, a display device includes a substrate. A plurality of emission portions is disposed on the substrate. The plurality of emission portions emits a light. A plurality of light sensing portions is disposed on the substrate. The plurality of light sensing portions senses an incident light. A bank layer partitions the plurality of emission portions and the plurality of light sensing portions. A touch sensing layer is disposed on the bank layer. The touch sensing layer includes a first touch insulating pattern disposed on the bank layer. The first touch insulating pattern partitions a light opening overlapping the plurality of light sensing portions. A touch electrode is disposed on the first touch insulating pattern. A cross-sectional shape of the first touch insulating pattern has a reverse tapered shape having a width that decreases in a direction towards a top surface of the substrate.

In an embodiment, the touch electrode comprises a first touch pattern disposed on a top surface of the first touch insulating pattern, and a second touch pattern disposed on a side surface of the first touch insulating pattern.

In an embodiment, the first touch pattern protrudes from the side surface of the first touch insulating pattern towards a central portion of the light opening.

In an embodiment, the second touch pattern directly contacts the side surface of the first touch insulating pattern.

In an embodiment, the second touch pattern covers an entirety of the side surface of the first touch insulating pattern.

In an embodiment, the first touch pattern comprises a mesh pattern.

In an embodiment, the first touch insulating pattern comprises a first reverse tapered surface adjacent to the light opening. An inclination angle of the first reverse tapered surface is in a range of about 65 degrees to about 90 degrees.

In an embodiment, a first distance between the touch electrode and a center of an adjacent light sensing portion of the plurality of light sensing portions in one direction is less than a second distance between the touch electrode and a center of a first emission portion among the plurality of emission portions in the one direction. The first emission portion is adjacent to the touch electrode.

In an embodiment, a width of the adjacent light sensing portion in the one direction is greater than the first distance.

In an embodiment, a ratio of the width of the adjacent light sensing portion to the first distance is in a range of about 1.8 to about 2.

In an embodiment, the first emission portion and the light sensing portion are repeatedly arranged with each other along the one direction.

In an embodiment, the display device further comprises a light emitting layer disposed on each of the plurality of emission portions, on the substrate, a photoelectric conversion layer disposed on each of the plurality of light sensing portions, on the substrate, and a common electrode disposed on the light emitting layer and the photoelectric conversion layer.

In an embodiment, a cross-sectional shape of the light opening is a tapered shape having a width that increases in a direction towards a top surface of the substrate.

According to an embodiment of the present disclosure, a display device includes a substrate. A plurality of emission portions is disposed on the substrate. The plurality of emission portions emits light. A plurality of light sensing portions is disposed on the substrate. The plurality of light sensing portions senses an incident light. A bank layer partitions the plurality of emission portions and the plurality of light sensing portions. A touch sensing layer is disposed on the bank layer. The touch sensing layer comprises a first touch insulating pattern disposed on the bank layer. The first touch insulating pattern partitions a light opening overlapping the light sensing portion. A first touch pattern is disposed on a top surface of a first touch insulating pattern. A second touch pattern is disposed on a side surface of the first touch insulating pattern. An opening width of the second touch pattern increases in a direction towards a top surface of the substrate.

In an embodiment, an angle between the top surface of the first touch insulating pattern and the side surface of the first touch insulating pattern is an acute angle.

In an embodiment, the second touch pattern covers an entirety of the side surface of the first touch insulating pattern.

In an embodiment, the first touch pattern comprises a mesh pattern.

In an embodiment, a first distance between the first touch pattern and an adjacent light sensing portion of the plurality of light sensing portions in one direction is less than a second distance between the first touch pattern and a first emission portion among the plurality of emission portions in the one direction. The first emission portion is adjacent to the first touch pattern.

In an embodiment, a width of the adjacent light sensing portion in the one direction is greater than the first distance.

In an embodiment, a ratio of the width of the adjacent light sensing portion to the first distance in the one direction is in a range of about 1.8 to about 2.

In the display device according to an embodiment, a first touch pattern disposed on a touch sensing layer may be disposed to overlap the light sensing portion, and a second touch pattern may be formed at a reverse taper angle, thereby allowing light incident through the light opening to be reflected toward the light sensing portion. Accordingly, the display device may accurately identify the user's fingerprint by detecting the incident light.

However, effects according to embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

The present disclosure will now be described more fully hereinafter with reference to the accompanying drawings, in which embodiments of the present disclosure are shown. The present disclosure may, however, be embodied in different forms and should not be construed as limited to embodiments set forth herein.

It will also be understood that when a layer is referred to as being "on" another layer or substrate, it can be directly on the other layer or substrate, or intervening layers may also be present. When a layer is referred to as being "directly on" another layer or substrate, no intervening layers may be present The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, specific embodiments will be described with reference to the accompanying drawings.

Figure 1:
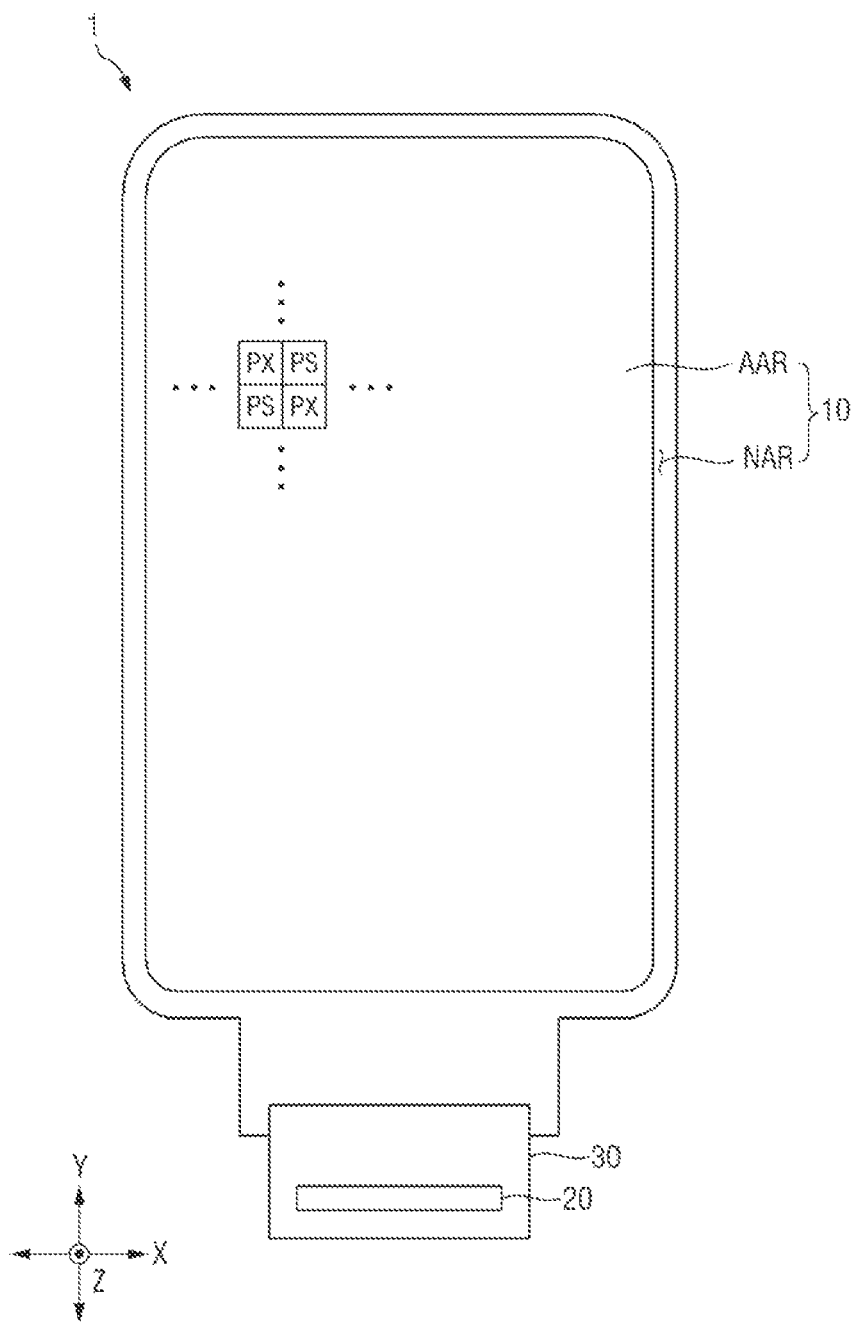
FIG. 1 is a plan view of a display device according to an embodiment of the present disclosure.

FIG. 1 is a plan view of a display device according to an embodiment of the present disclosure.

In FIG. 1, a first direction X, a second direction Y, and a third direction Z are shown. In an embodiment, the first direction X may be a direction parallel to a first side of a display device 1 in a plan view and may be, for example, a horizontal direction of the display device 1. A second direction Y may be a direction parallel to a second side of the display device 1 in direct contact with the first side of the display device 1 in a plan view and may be, for example, a vertical direction of the display device 1. Hereinafter, for simplicity of description, it is assumed that one side of the first direction X refers to a rightward direction in a plan view, the other side of the first direction X refers to a leftward direction in a plan view, one side of the second direction Y refers an upward direction in plan view, and the other side of the second direction Y refers to a downward direction in plan view, respectively. The third direction Z may be a thickness direction of the display device 1. It should be understood, however, that a direction mentioned in the embodiment refers to a relative direction and embodiments of the present disclosure are not necessarily limited thereto. In some embodiments, the first to third directions X, Y, Z may cross each other at various different angles.

Unless otherwise defined, with respect to the third direction Z, the terms "above," and "top surface" as used herein refer to a display surface side of a display panel 10, and the terms "below," "bottom surface," and "rear surface" as used herein refer to a side opposite to the display surface of the display panel 10.

Referring to FIG. 1, the display device 1 may include various electronic devices that provide a display screen. Examples of the display device 1 may include, but are not necessarily limited to, a mobile phone, a smart phone, a tablet personal computer (PC), a mobile communication terminal, an electronic notebook, an electronic book, a personal digital assistant (PDA), a portable multimedia player (PMP), a navigation device, an ultra-mobile PC (UMPC), a television, a game console, a wrist watch type electronic device, a head-mounted display, a personal computer monitor, a laptop computer, a car dashboard, a digital camera, a camcorder, an external billboard, an electric billboard, various medical devices, various inspection devices, various home appliances including a display area such as a refrigerator or a washing machine, an Internet-of-Things (IoT) device, and the like. A typical example of the display device 1 to be described later may be a smart phone, a tablet PC, or a laptop computer. However, embodiments of the present disclosure are not necessarily limited thereto.

The display device 1 may include a display panel 10, a panel driver 20, and a circuit board 30.

The display panel 10 includes an active region AAR and a non-active region NAR.

The active region AAR includes a display area on which one or more images are displayed. The active region AAR may completely overlap the display area. A plurality of pixels PX for displaying an image may be disposed in the display area. Each pixel PX may include an emission portion EMA (see FIG. 8) that emits light.

The active region AAR further includes a light sensing area. The light sensing area is a region that reacts to light, and is configured to sense the amount or wavelength of incident light. The light sensing area may overlap the display area. In an embodiment, the light sensing area may completely overlap the active region AAR in plan view. In this embodiment, the light sensing area and the display area may be the same. However, embodiments of the present disclosure are not necessarily limited thereto. For example, in some embodiments, the light sensing area may be disposed only in a portion of the active region AAR. For example, the light sensing area may be disposed only in a limited area necessary for fingerprint recognition. In this embodiment, the light sensing area may overlap only a portion of the display area while it does not overlap another portion of the display area.

A plurality of optical sensors PS that react to light may be disposed in the light sensing area. Each optical sensor PS may include a light sensing portion RA (see FIG. 8) that detects incident light.

The non-active region NAR may be disposed around the active region AAR (e.g., in the first and/or second directions X, Y). For example, in an embodiment, the non-active region NAR may fully surround the active region AAR (e.g., in the first and/or second directions X, Y). The panel driver 20 may be disposed in the non-active region NAR. The panel driver 20 may drive the plurality of pixels PX and/or the plurality of optical sensors PS. The panel driver 20 may output signals and voltages for driving the display panel 10. The panel driver 20 may be formed as an integrated circuit (IC) and mounted on the display panel 10. Signal lines for transferring signals between the panel driver 20 and the active region AAR may be further disposed in the non-active region NAR. However, embodiments of the present disclosure are not necessarily limited thereto. For example, in an embodiment the panel driver 20 may be mounted on the circuit board 30.

The circuit board 30 may be attached to one end of the display panel 10 using an anisotropic conductive film (ACF). Lead lines of the circuit board 30 may be electrically connected to a pad portion of the display panel 10. The circuit board 30 may be a flexible film such as a flexible printed circuit board or a chip on film.

Figure 2:
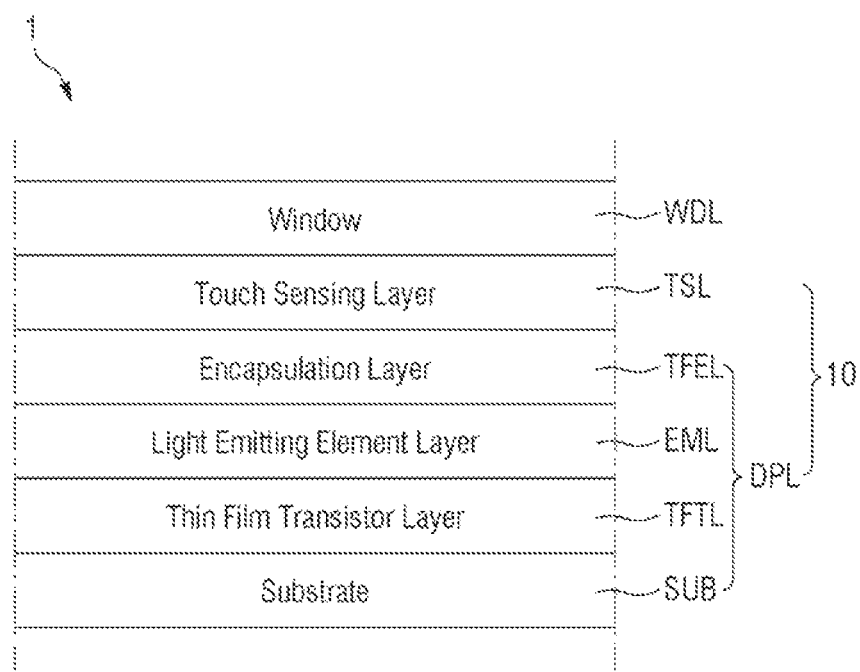
FIG. 2 is a schematic cross-sectional view of a display device according to an embodiment of the present disclosure.

FIG. 2 is a schematic cross-sectional view of a display device according to an embodiment.

Referring to FIG. 2, the display device 1 may include a display layer DPL, a touch sensing layer TSL, and a window WDL. The display layer DPL and the touch sensing layer TSL may constitute the display panel 10. The display layer DPL may include a substrate SUB, a thin film transistor layer TFTL disposed on the substrate SUB, a light emitting element layer EML, and an encapsulation layer TFEL.

In an embodiment, the substrate SUB may be a rigid substrate or a flexible substrate which can be bent, folded or rolled. The substrate SUB may be formed of an insulating material such as glass, quartz, or a polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), or a combination thereof. However, embodiments of the present disclosure are not necessarily limited thereto.

The thin film transistor layer TFTL disposed on the substrate SUB may include a plurality of thin film transistors for driving pixels, and a plurality of display signal lines. The plurality of display signal lines may include a scan line transmitting a scan signal to each pixel, and a data line transmitting a data signal to each pixel.

Figure 4:
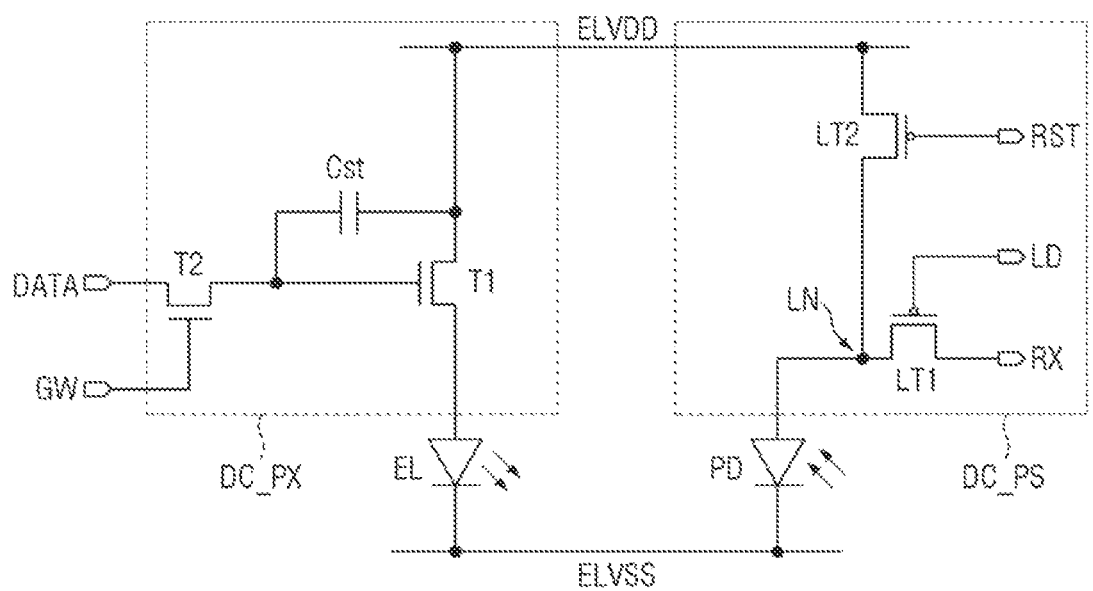
FIG. 4 is a circuit diagram illustrating a pixel and an optical sensor of a display layer according to an embodiment of the present disclosure.

The light emitting element layer EML disposed on one surface of the thin film transistor layer TFTL may include light emitting elements EL (see FIG. 9) that emit light and photoelectric conversion elements PD (see FIG. 4).

Each of the light emitting elements EL may emit the light of a predetermined luminance by an anode voltage and a cathode voltage applied from the thin film transistor layer TFTL.

In an embodiment, each of the light emitting elements EL may be an organic light emitting diode including an anode electrode, a cathode electrode, and an organic light emitting layer disposed between the anode electrode and the cathode electrode. Alternatively, each of the light emitting elements EL may be an inorganic light emitting element including an anode electrode, a cathode electrode, and an inorganic semiconductor disposed between the anode electrode and the cathode electrode. Alternatively, each of the light emitting elements EL may be a quantum dot light emitting element including an anode electrode, a cathode electrode, and a quantum dot light emitting layer disposed between the anode electrode and the cathode electrode. Alternatively, each of the light emitting elements EL may be a micro light emitting diode.

Each of the photoelectric conversion elements PD may generate photocharges in proportion to incident light. Accumulated photocharges may be converted into an electrical signal required for sensing based on an anode voltage and a cathode voltage applied from the thin film transistor layer TFTL.

Each of the photoelectric conversion elements PD may include an anode electrode, a cathode electrode, and a photoelectric conversion layer disposed between the anode electrode and the electrode. Each of the photoelectric conversion elements PD may convert externally incident light into an electrical signal. The photoelectric conversion element PD may be a light receiving diode or a phototransistor formed of a pn-type or pin-type inorganic material. Alternatively, the photoelectric conversion element PD may be an organic light receiving diode using an organic material.

The encapsulation layer TFEL may be disposed on the light emitting element layer EML. In an embodiment, the encapsulation layer TFEL may include a stacked layer of inorganic layers or organic layers to prevent moisture or oxygen from permeating the light emitting elements of the light emitting element layer EML.

The touch sensing layer TSL may be disposed on the encapsulation layer TFEL. The touch sensing layer TSL may include a plurality of touch electrodes (e.g., IE1 and IE2 in FIG. 5) for sensing the user's touch and a plurality of signal lines (e.g., TL and RL in FIG. 5). The touch sensing layer TSL may sense the user's touch using a self-capacitance scheme or a mutual capacitance scheme.

The window WDL may be disposed on the touch sensing layer TSL. In an embodiment, the window WDL may include a rigid material such as glass or quartz. The window WDL may include, for example, a window member. In an embodiment, the window WDL may be attached on the touch sensing layer TSL by an optically clear adhesive or the like.

In an embodiment, a polarizing film for reducing external light reflection may be additionally disposed between the touch sensing layer TSL and the window WDL.

Figure 3:
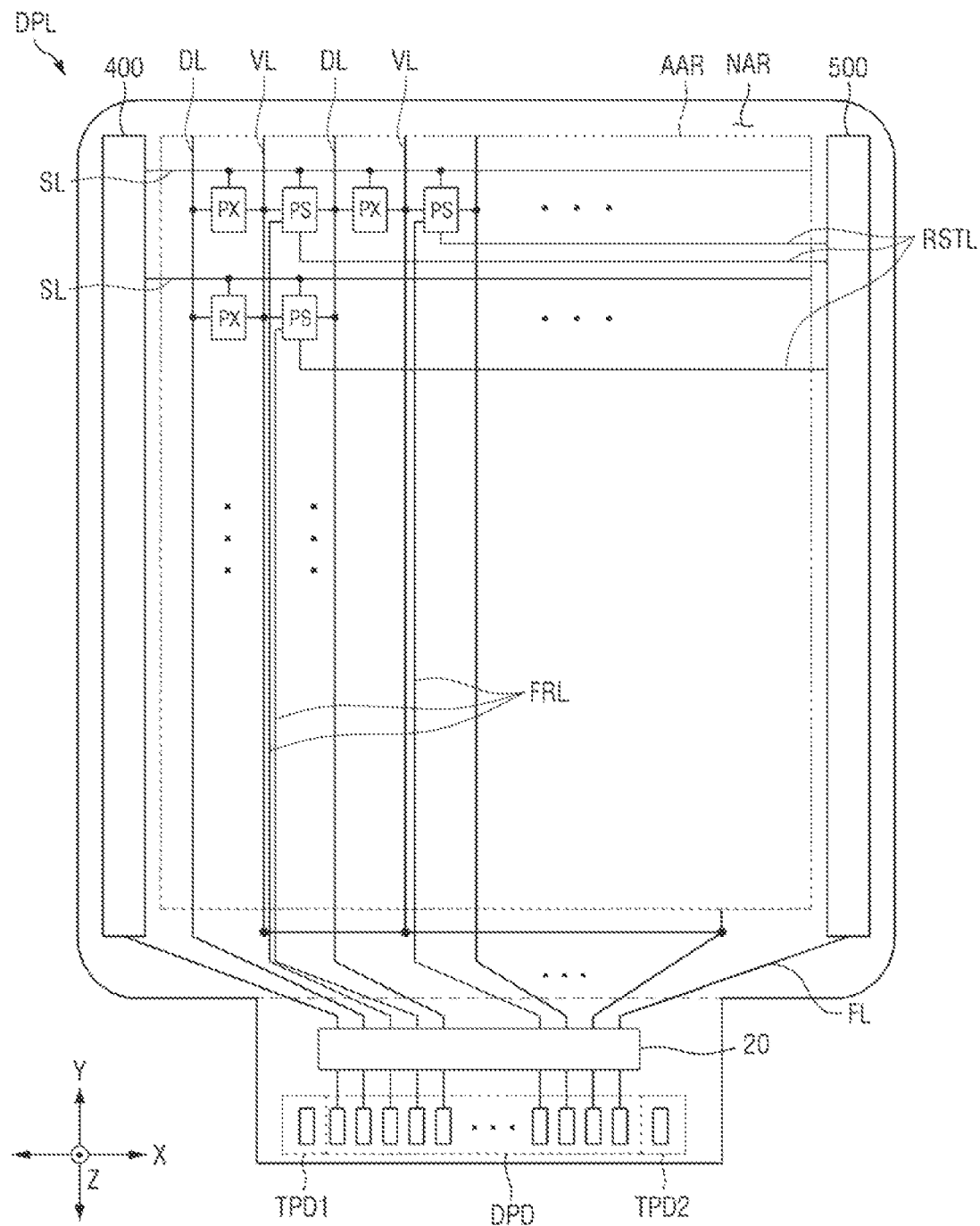
FIG. 3 is a schematic plan layout view of a display layer according to an embodiment of the present disclosure.

FIG. 3 is a schematic plan layout view of a display layer according to an embodiment.

Referring to FIG. 3, scan lines SL and power voltage lines VL connected to the plurality of pixels PX and the plurality of optical sensors PS, data lines DL connected to the plurality of pixels PX, and reset lines RSTL and sensing lines FRL connected to the plurality of optical sensors PS may be disposed in the active region AAR of the display layer DPL.

The scan line SL may supply the scan signal received from a scan driver 400 to the plurality of pixels PX and the plurality of optical sensors PS. The scan lines SL may extend in the first direction X and may be spaced apart from each other in the second direction Y.

The data line DL may supply the data voltage received from the panel driver 20 to the plurality of pixels PX. The data lines DL may extend in the second direction Y and may be spaced apart from each other in the first direction X.

The power voltage line VL may supply the power voltage received from the panel driver to the plurality of pixels PX and the plurality of optical sensors PS. In an embodiment, the power voltage may be at least one of a first power voltage ELVDD (FIG. 4), a second power voltage ELVSS (FIG. 4), or an initialization voltage. The power voltage lines VL may extend from the active region AAR in the second direction Y, may be spaced apart from each other in the first direction X, and may be connected to each other in the non-active region NAR.

The reset line RSTL may supply a reset signal received from a reset signal generator 500 to the plurality of optical sensors PS. The reset lines RSTL may extend in the first direction X and may be spaced apart from each other in the second direction Y.

The sensing line FRL may supply a current generated by the photocharges of the optical sensor PS to a fingerprint sensing portion. The sensing lines FRL may extend in the second direction Y and may be spaced apart from each other in the first direction X.

The non-active region NAR of the display layer DPL may include the scan driver 400, fan-out lines FL, the reset signal generator 500, and the panel driver 20.

The scan driver 400 may generate a plurality of scan signals based on a scan control signal, and may sequentially supply the plurality of scan signals to the plurality of scan lines SL according to a set order.

The fan-out lines FL may extend from the panel driver 20 to the active region AAR. The fan-out lines FL may supply the data voltage received from the panel driver 20 to the plurality of data lines DL. In addition, the fan-out lines FL may transmit a current received from the sensing lines FRL to the panel driver 20.

The reset signal generator 500 may generate a plurality of reset signals based on a reset control signal, and may sequentially supply the reset signals to the plurality of reset lines RSTL in a set order. The optical sensor PS connected to the reset line RSTL may receive the reset signal. However, embodiments of the present disclosure are not necessarily limited thereto. For example, in some embodiments the reset signal generator 500 may be omitted.

The panel driver 20 may output signals and voltages for driving the display panel 10 to the fan-out lines FL. The panel driver 20 may supply a data voltage to the data line DL through the fan-out lines FL. The data voltage may be supplied to the plurality of pixels PX, and the luminance of the plurality of pixels PX may be determined.

In an embodiment, the panel driver 20 may include the fingerprint sensing portion. The fingerprint sensing portion may measure the magnitude of the current of the optical sensor PS through the sensing line FRL. The fingerprint sensing portion may generate fingerprint sensing data based on the magnitude of the current sensed in the optical sensor PS and transmit the generated fingerprint sensing data to a main processor. In an embodiment, by analyzing the fingerprint sensing data, the main processor may determine whether the fingerprint detection data matches the user's fingerprint by comparing the fingerprint detection data with a preset fingerprint. However, embodiments of the present disclosure are not necessarily limited thereto. For example, in an embodiment, the fingerprint sensing portion may be formed as an integrated circuit separate from the panel driver 20.

Further, the panel driver 20 may supply the scan control signal to the scan driver 400 through the scan control line.

The non-active region NAR of the display layer DPL may further include a display pad unit DPD and first and second touch pad units TPD1 and TPD2. In an embodiment, the display pad unit DPD, the first touch pad unit TPD1, and the second touch pad unit TPD2 may be electrically connected to the circuit board 30 by using a low-resistance high-reliability material such as an anisotropic conductive film or SAP. The display pad unit DPD may include a plurality of display pads.

In an embodiment shown in FIG. 3, each scan line SL is illustrated as being simultaneously connected to the plurality of pixels PX and the plurality of optical sensors PS. However, embodiments of the present disclosure are not necessarily limited thereto, and the type and disposition shape of the signal lines may vary. In an embodiment, the plurality of pixels PX and the plurality of optical sensors PS may be turned on or off based on the same scan signal. Accordingly, the shape of the fingerprint may be optically sensed during the period when the screen is displayed.

FIG. 4 is a circuit diagram illustrating a pixel and an optical sensor of a display layer according to an embodiment.

Referring to FIG. 4, the display panel 10 may include a display driving circuit DC_PX for controlling the amount of light emitted by the plurality of pixels PX, and a sensing driving circuit DC_PS for controlling the amount of light received by the plurality of optical sensors PS. The display panel 10 may apply a driving signal or a driving voltage to one or more transistors and various signal lines included in the display driving circuit DC_PX and the sensing driving circuit DC_PS.

In an embodiment, the display driving circuit DC_PX and the sensing driving circuit DC_PS may each be formed as a separate circuit, or may be formed as one integrated circuit as shown in the drawing.

The display driving circuit DC_PX may include the light emitting element EL, a capacitor Cst, a first transistor T1, and a second transistor T2. The display driving circuit DC_PX may receive a data signal DATA, a first scan signal GW, the first power voltage ELVDD, and the second power voltage ELVSS. In an embodiment, the data signal DATA may be provided from the panel driver 20 connected to the data line DL, and the first scan signal GW may be provided from the scan driver 400 connected to the scan line SL.

The light emitting element EL is exemplified as an organic light emitting diode including an anode electrode, a cathode electrode, and a light emitting layer 175 (see FIG. 9) disposed between the anode electrode and the cathode electrode. The anode electrode of the light emitting element EL is connected to the first transistor T1. The cathode electrode of the light emitting element EL may be connected to the terminal of the second power voltage ELVSS to receive the second power voltage ELVSS. In an embodiment, the anode electrode of the light emitting element EL may correspond to a pixel electrode 170 of FIG. 9, and the cathode electrode thereof may correspond to a common electrode 190 of FIG. 9.

The capacitor Cst is connected between the gate electrode of the first transistor T1 and the terminal of the first power voltage ELVDD. The capacitor Cst includes a first capacitor electrode connected to the gate electrode of the first transistor T1 and a second capacitor electrode connected to the terminal of the first power voltage ELVDD.

In an embodiment, the first transistor T1 may be a driving transistor, and the second transistor T2 may be a switching transistor. Each transistor may include a gate electrode, a source electrode, and a drain electrode. Any one of the source electrode and the drain electrode may be one electrode, and the other thereof may be the other electrode. Hereinafter, an embodiment in which the drain electrode is one electrode and the source electrode is the other electrode is exemplified for simplicity of description.

The first transistor T1 may generate a driving current, as the driving transistor. The gate electrode of the first transistor T1 is connected to the first capacitor electrode, one electrode thereof is connected to the terminal of the first power voltage ELVDD, and the other electrode thereof is connected to the anode electrode of the light emitting element EL. The second capacitor electrode is connected to the one electrode of the first transistor T1. In cross-sectional view, the first transistor T1 may be a first thin film transistor TFT1 (see FIG. 9) disposed in the thin film transistor layer TFTL and connected to the pixel electrode 170.

The second transistor T2 is a switching transistor, and the gate electrode of the second transistor T2 is connected to the terminal of the first scan signal GW, one electrode thereof is connected to the terminal of the data signal DATA, and the other electrode thereof is connected to the gate electrode of the first transistor T1. The second transistor T2 may be turned on in response to the first scan signal GW to perform a switching operation of transferring the data signal DATA to the gate electrode of the first transistor T1.

The capacitor Cst may be charged with a voltage corresponding to the data signal DATA received from the second transistor T2. The first transistor T1 may control a driving current flowing through the light emitting element EL in response to the amount of charges stored in the capacitor Cst.

However, embodiments of the present disclosure are not necessarily limited thereto. For example, in an embodiment, the display driving circuit DC_PX may have a structure further including a compensation circuit for compensating a threshold voltage deviation ΔVth of the first transistor T1.

The sensing driving circuit DC_PS may include a sensing transistor LT1, a reset transistor LT2, and the photoelectric conversion element PD. In addition, the sensing driving circuit DC_PS may further include a sensing node LN between the sensing transistor LT1, the reset transistor LT2, and the photoelectric conversion element PD. The sensing driving circuit DC_PS may receive a fingerprint scan signal LD, a fingerprint sensing signal RX, and a reset signal RST. The fingerprint scan signal LD may be provided from the scan driver 400 connected to the scan line SL. However, embodiments of the present disclosure are not necessarily limited thereto. The fingerprint sensing signal RX may be provided from the panel driver 20 (or the fingerprint sensing portion) connected to the sensing line FRL. The reset signal RST may be provided from the reset signal generator 500 connected to the reset line RSTL.

In an embodiment, the photoelectric conversion element PD may be a phototransistor, or an organic light emitting diode including an anode electrode, a cathode electrode, and a photoelectric conversion layer 185 (see FIG. 10) disposed between the anode electrode and the cathode electrode. The anode electrode of the photoelectric conversion element PD is connected to the sensing node LN. The cathode electrode of the photoelectric conversion element PD may be connected to the terminal of the second power voltage ELVSS to receive the second power voltage ELVSS. In an embodiment, the anode electrode of the photoelectric conversion element PD may correspond to a first electrode 180 of FIG. 10, and the cathode electrode thereof may correspond to the common electrode 190.

The photoelectric conversion element PD may generate photocharges when exposed to external light, and the generated photocharges may be accumulated in the anode electrode of the photoelectric conversion element PD. In this embodiment, the voltage of the sensing node LN electrically connected to the anode electrode may be boosted. When the terminal of the fingerprint sensing signal RX is connected to the photoelectric conversion element PD, a current may flow due to a difference between the voltage of the sensing node LN having accumulated charges and the voltage of the sensing line FRL.

Figure 10:
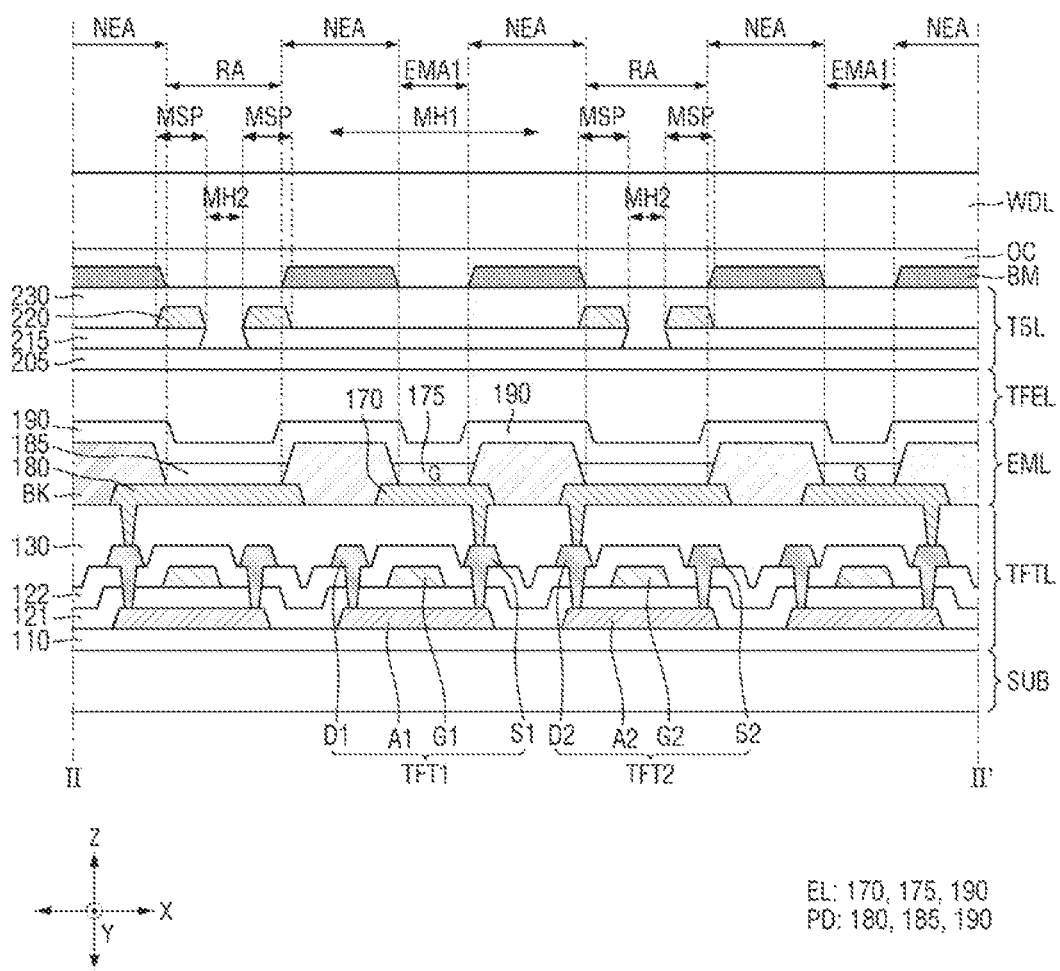
FIG. 10 is a cross-sectional view illustrating the display device taken along line II-II' of FIG. 8 according to an embodiment of the present disclosure.

The sensing transistor LT1 may have a gate electrode connected to the terminal of the fingerprint scan signal LD, one electrode connected to the sensing node LN, and the other electrode connected to the terminal of the fingerprint sensing signal RX. The sensing transistor LT1 may be turned on in response to the fingerprint scan signal LD to transmit a current flowing through the photoelectric conversion element PD to the terminal of the fingerprint sensing signal RX. In an embodiment, the sensing transistor LT1 may be a second thin film transistor TFT2 of the thin film transistor layer TFTL, as shown in FIG. 10.

The reset transistor LT2 may have a gate electrode connected to the terminal of the reset signal RST, one electrode connected to the first power voltage ELVDD terminal, and the other electrode connected to the sensing node LN. In this embodiment, the sensing node LN and the anode electrode of the photoelectric conversion element PD may be reset to the first power voltage ELVDD.

Although the drawing illustrates an embodiment in which each transistor is an NMOS transistor, some or all of the transistors may be provided as PMOS transistors.

Figure 5:
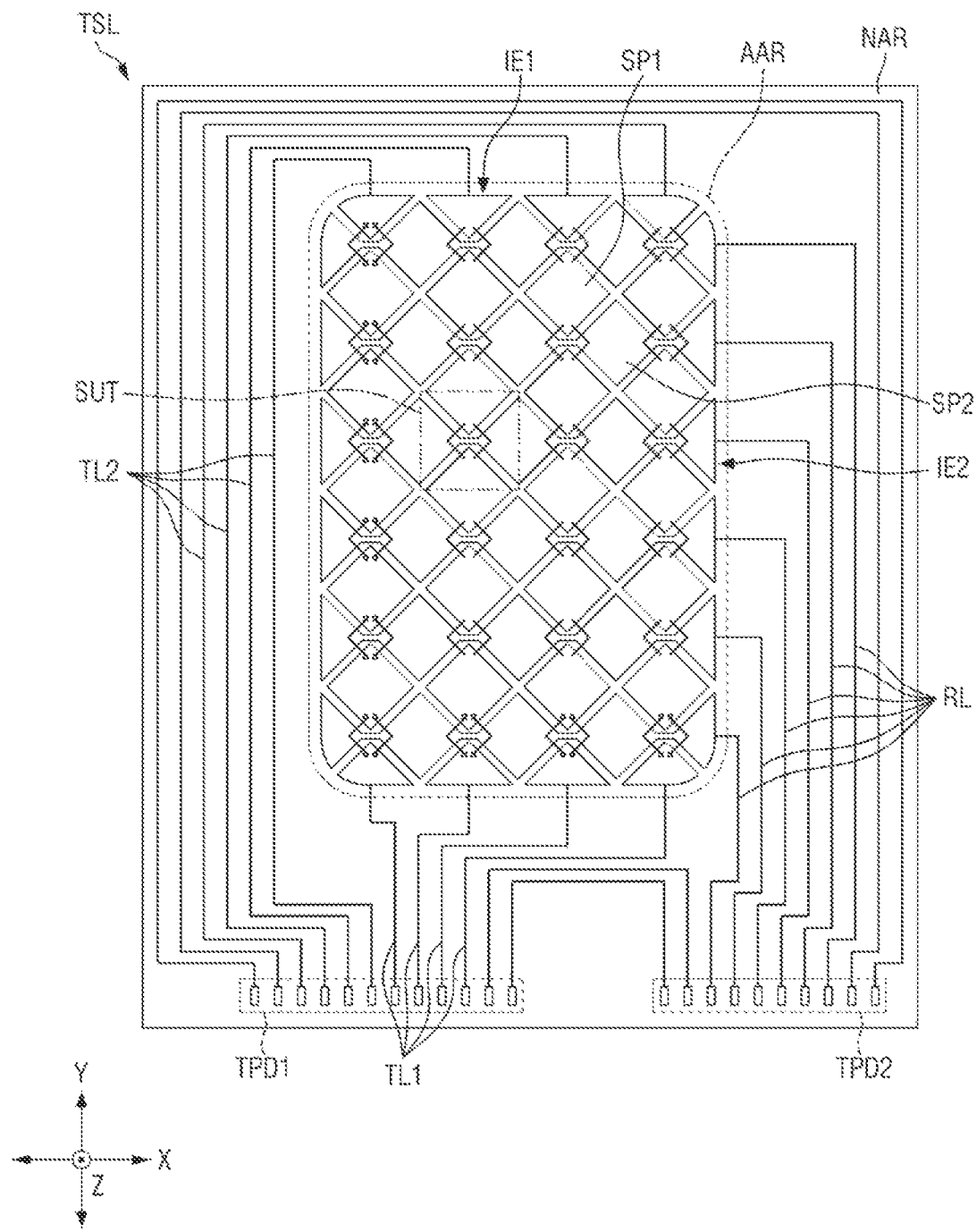
FIG. 5 is a schematic plan layout view of a touch sensing layer of a display panel according to an embodiment of the present disclosure.

FIG. 5 is a schematic plan layout view of a touch sensing layer of a display panel according to an embodiment.

Referring to FIG. 5, the touch sensing layer TSL includes the active region AAR and the non-active region NAR. The active region AAR may be a touch sensing area for sensing a user's touch, and the non-active region NAR may be a touch peripheral area disposed in the periphery of the touch sensing area in which a user's touch is not sensed. The touch sensing area may overlap the display area and the light sensing area of the display layer DPL described above, and may overlap the non-display area of the display layer DPL described above in the touch peripheral area.

The active region AAR may include a plurality of first touch electrodes IE1 and a plurality of second touch electrodes IE2. One of the first touch electrode IE1 and the second touch electrode IE2 may be a driving electrode, and the other may be a sensing electrode. In the an embodiment shown in FIG. 5, the first touch electrode IE1 is a driving electrode and the second touch electrode IE2. However, embodiments of the present disclosure are not necessarily limited thereto.

The first touch electrode IE1 may extend in the second direction Y. The first touch electrode IE1 may include a plurality of first sensor portions SP1 arranged along the second direction Y and a first connection portion CP1 electrically connecting the adjacent first sensor portions SP1 to each other. The plurality of first touch electrodes IE1 may be arranged in the first direction X.

The second touch electrode IE2 may extend in the first direction X. The second touch electrode IE2 may include a plurality of second sensor portions SP2 arranged in the first direction X and a second connection portion CP2 electrically connecting the adjacent second sensor portions SP2 to each other. The plurality of second touch electrodes IE2 may be arranged in the second direction Y.

Figure 6:
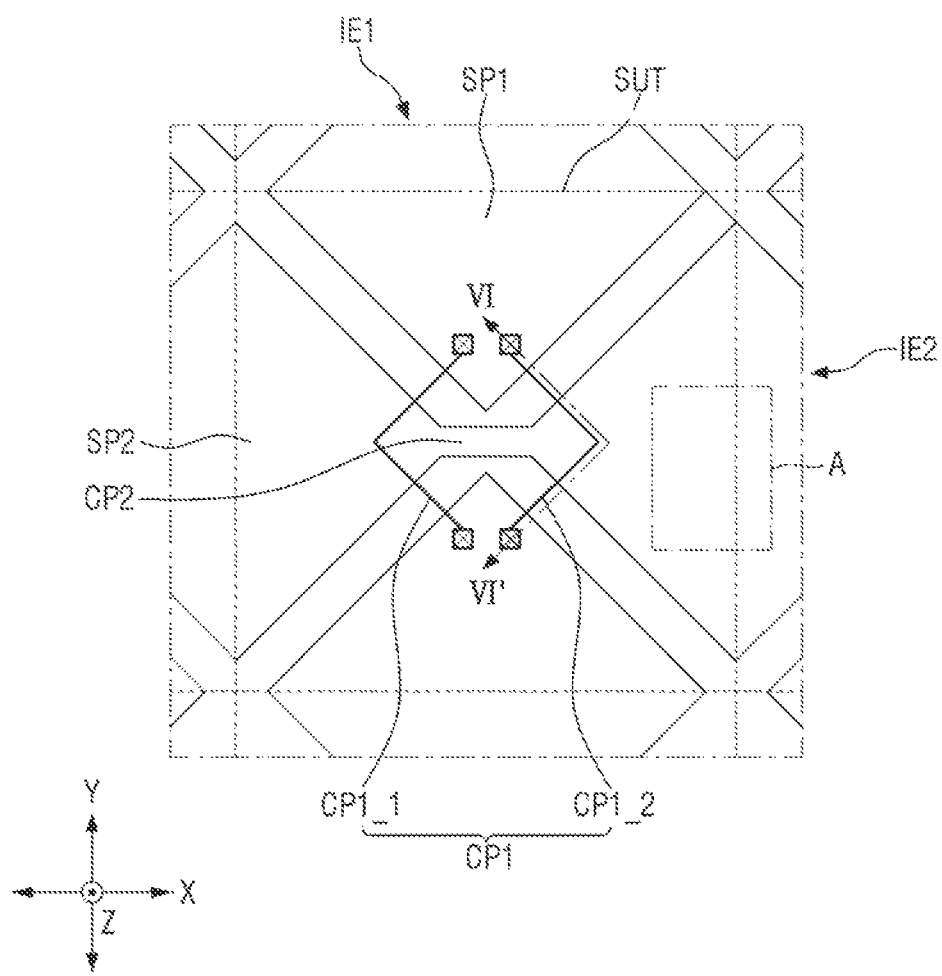
FIG. 6 is a partially enlarged view of a unit sensing area of FIG. 5 according to an embodiment of the present disclosure.

FIG. 6 is a partially enlarged view of a unit sensing area of FIG. 5.

Referring to FIGS. 5 and 6, in an embodiment at least some of the first sensor portions SP1 and the second sensor portions SP2 may have a rhombic shape. Some of the first sensor portions SP1 and the second sensor portions SP2 may have a shape of a figure cut from a rhombus. For example, each of the first sensor portions SP1 and the second sensor portions SP2 positioned at both ends in the extending direction may have a triangular shape obtained by cutting a rhombus in half. The first sensor portions SP1 having a rhombic or triangular shape and the second sensor portions SP2 having a rhombic or triangular shape may have substantially the same size and shape. However, embodiments of the present disclosure are not necessarily limited thereto, and the shapes and sizes of the first sensor portion SP1 and the second sensor portion SP2 may be variously modified.

The first connection portion CP1 (CP1_1 and CP1_2) may connect the corner parts of the adjacent rhombic or triangular first sensor portions SP1 to each other. The second connection portion CP2 may connect the corner parts of the adjacent rhombic or triangular second sensor portions SP2 to each other. In an embodiment, the widths of the first connection portion CP1 and the second connection portion CP2 may be less than the widths of the first sensor portion SP1 and the second sensor portion SP2.

The first touch electrode IE1 and the second touch electrode IE2 may be insulated from each other so that they may intersect each other. In an embodiment, insulation between the first touch electrode IE1 and the second touch electrode IE2 may be provided by being connected through conductive layers positioned on different layers in the intersecting region. For example, intersection between the first touch electrode IE1 and the second touch electrode IE2 may be achieved by the first connection portion CP1 and/or the second connection portion CP2. For the insulation and intersection, at least one of the first connection portion CP1 or the second connection portion CP2 may be positioned on a different layer from the first touch electrode IE1 and the second touch electrode IE2. The stacked structure of the touch sensing layer TSL will be described with reference to FIG. 7.

The first sensor portions SP1 and the second sensor portions SP2 adjacent to each other may constitute a unit sensing area SUT. For example, half of two adjacent first sensor portions SP1 and half of two adjacent second sensor portions SP2 with respect to a region where the first touch electrode IE1 and the second touch electrode IE2 intersect may constitute a single square or rectangle. As described above, an area defined by the half areas of the two adjacent first and second sensor portions SP1 and SP2 may be one unit sensing area SUT. A plurality of unit sensing areas SUT may be arranged in a matrix.

In each unit sensing area SUT, by measuring the capacitance value between the adjacent first and second sensor portions SP1 and SP2, it is possible to determine whether or not a touch is inputted and to calculate the corresponding position as touch input coordinates. In an embodiment, the touch sensing may be performed in a mutual capacitance method. However, embodiments of the present disclosure are not necessarily limited thereto.

Each unit sensing area SUT may be larger in size than a pixel. For example, the unit sensing area SUT may correspond to a plurality of pixels. In an embodiment, the length of one side of the unit sensing area SUT may be in the range of about 4 to about 5 mm. However, embodiments of the present disclosure are not necessarily limited thereto.

Referring to FIG. 5, a plurality of touch signal lines are disposed in the non-active region NAR. The touch signal line extends from the first and second touch pad units TPD1 and TPD2 to the non-active region NAR.

In an embodiment the plurality of touch signal lines includes a plurality of touch driving lines TL (TL1 and TL2) and a plurality of touch sensing lines RL. The plurality of touch signal lines may further include a touch ground line and/or a touch antistatic line.

The touch driving line TL may be connected to the first touch electrode IE1. In an embodiment, a plurality of touch driving lines may be connected to the one first touch electrode IE1. For example, the touch driving line TL may include a first touch driving line TL1 connected to a lower end of the first touch electrode IE1 (e.g., in the Y direction) and a second touch driving line TL2 connected to an upper end (e.g., in the Y direction) of the first touch electrode IE1. In an embodiment, the first touch driving line TL1 may extend from the first touch pad unit TPD1 to one side in the second direction Y to be connected to the lower end of the first touch electrode IE1. The second touch driving line TL2 may extend from the first touch pad unit TPD1 to one side in the second direction Y and bypass the left edge of the active region AAR (e.g., the touch sensing area) to be connected to the upper end of the first touch electrode IE1.

The touch sensing line RL may be connected to the second touch electrode IE2. In an embodiment, one touch sensing line RL may be connected to one second touch electrode IE2. Each touch sensing line RL may extend from the second touch pad unit TPD2 to one side in the second direction Y and extend toward the right edge of the active region AAR (e.g., touch sensing area) to be connected to a right end of the second touch electrode IE2.

In an embodiment in which the first touch electrode IE1 and the second touch electrode IE2 are driven by a mutual capacitance method, a driving signal is applied to the first touch electrode IE1 through the first and second touch driving lines TL1 and TL2, and the capacitance formed in the unit sensing area SUT is charged. Thereafter, a change in capacitance of the second touch electrode IE2 is measured through the touch sensing line RL to determine whether a touch is inputted.

Figure 7:
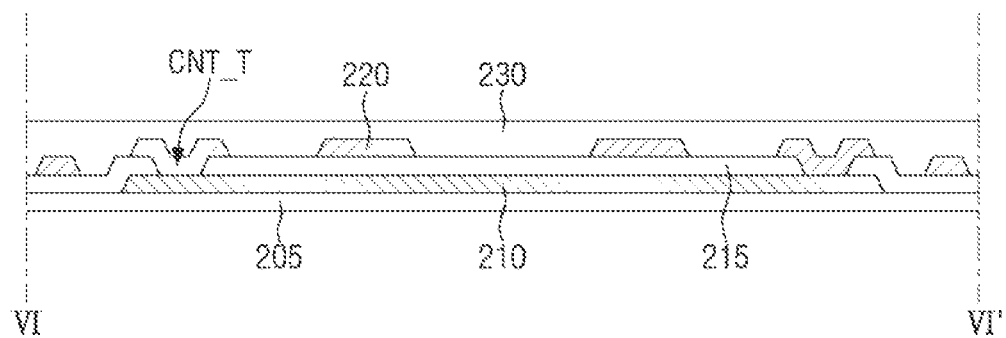
FIG. 7 is a cross-sectional view taken along line VI-VI' of FIG. 6 according to an embodiment of the present disclosure.

FIG. 7 is a cross-sectional view taken along line VI-VI' of FIG. 6.

Referring to FIGS. 6 and 7, the touch sensing layer TSL may include a base layer 205, a first touch conductive layer 210 on the base layer 205, a first touch insulating pattern 215 on the first touch conductive layer 210, a touch pattern 220 on the first touch insulating pattern 215, and a second touch insulating layer 230 covering the touch pattern 220.

In an embodiment, the first touch conductive layer 210 is disposed on the base layer 205. The first touch conductive layer 210 is covered by the first touch insulating pattern 215. The first touch insulating pattern 215 insulates the first touch conductive layer 210 from the touch pattern 220. The touch pattern 220 is disposed on the first touch insulating pattern 215. The second touch insulating layer 230 may cover the touch pattern 220 to protect it.

The base layer 205 may include an inorganic insulating material. For example, in an embodiment the base layer 205 may include a silicon nitride layer, a silicon oxynitride layer, a silicon oxide layer, a titanium oxide layer, an aluminum oxide layer, or the like. The base layer may be an inorganic layer constituting a thin film encapsulation layer to be described later.

In an embodiment, the first connection portion CP1 may be formed of the first touch conductive layer 210, and the first sensor portion SP1, the second sensor portion SP2, and the second connection portion CP2 may be formed of the first touch conductive layer 210 and the touch pattern 220 positioned with the first touch insulating pattern 215 interposed therebetween. Through such a structure, mutual insulation may be secured at a portion where the first touch electrode IE1 and the second touch electrode IE2 intersect. However, embodiments of the present disclosure are not necessarily limited thereto. For example, in some embodiments the second connection portion CP2 may be formed of the first touch conductive layer 210, and the first sensor portion SP1, the first connection portion CP1, and the second sensor portion SP2 may also be formed of the touch pattern 220.

The first sensor portion SP1 of the first touch electrode IE1 and the second sensor portion SP2 of the second touch electrode IE2 may each have a planar pattern or a mesh pattern. In an embodiment in which the first sensor portion SP1 and the second sensor portion SP2 have a planar pattern, the touch pattern 220 constituting the first sensor portion SP1 and the second sensor portion SP2 may be formed of a transparent conductive layer.

In an embodiment in which the first sensor portion SP1 and the second sensor portion SP2 have a mesh pattern, the first touch conductive layer 210 and the touch pattern 220 may be made of a low-resistance material such as aluminum (Al), molybdenum (Mo), gold (Au), titanium (Ti), nickel (Ni), or copper (Cu). However, embodiments of the present disclosure are not necessarily limited thereto.

An embodiment in which the first sensor portion SP1 and the second sensor portion SP2 are each formed in a mesh pattern will be described as an example. In this embodiment, the formation of parasitic capacitance between the first touch electrode IE1 and the second touch electrode IE2, and the common electrode 190 therebelow may be reduced.

The first touch insulating pattern 215 and the second touch insulating layer 230 may include an inorganic insulating material or an organic insulating material. In an embodiment, one of the first touch insulating pattern 215 and the second touch insulating layer 230 may include an inorganic material, and the other may include an organic material.

The first touch insulating pattern 215 may include a contact hole CNT_T. The first touch conductive layer 210 (e.g., the first connection portion CP1) and a portion of the touch pattern 220 (e.g., the first sensor portion SP1) may be electrically connected through the contact hole CNT_T.

In an embodiment in which each of the first sensor portion SP1 and the second sensor portion SP2 is formed in a mesh pattern, the touch pattern 220 constituting them may be disposed in a non-emission area of the display panel. If the touch pattern 220 is disposed on the non-emission area, it does not hamper light emission even if an opaque low-resistance metal is applied as the touch pattern 220, and it may not be visually recognized by a user.

Hereinafter, the arrangement of the pixels PX and the optical sensors PS of the display layer DPL, and the relative arrangement relationship of the mesh pattern of the touch sensing layer TSL with respect thereto according to an embodiment will be described with reference to FIG. 8.

Figure 8:
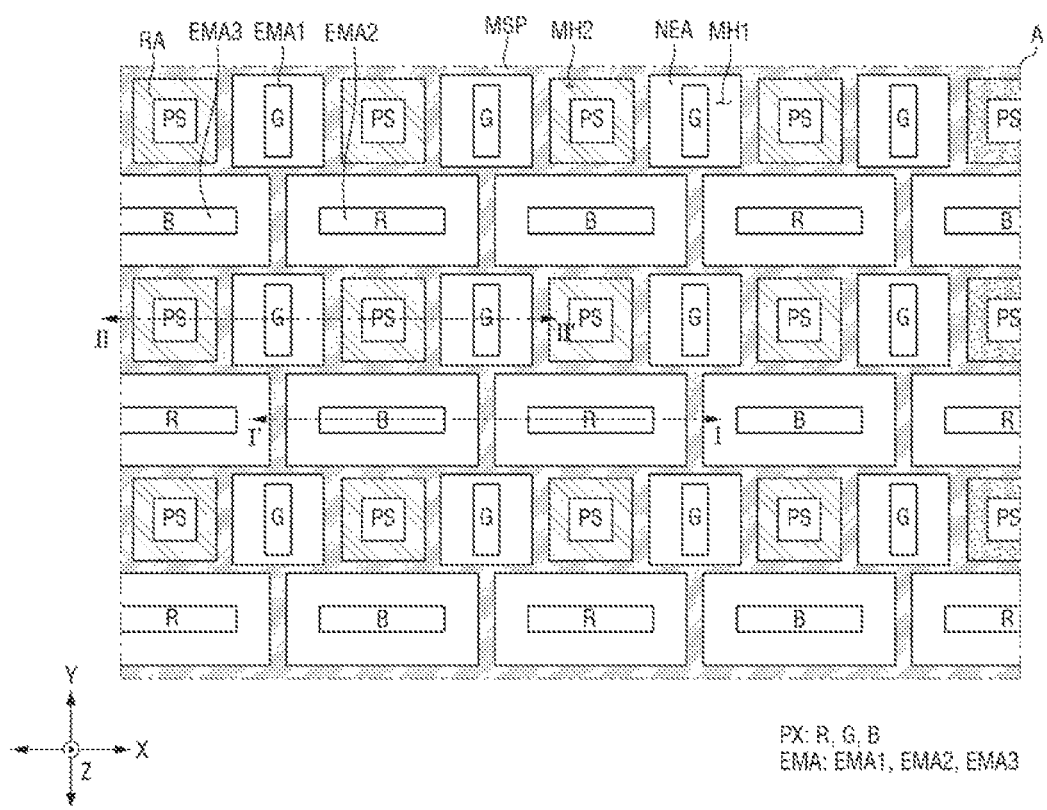
FIG. 8 is an enlarged view illustrating area A of FIG. 6 according to an embodiment of the present disclosure.

FIG. 8 is an enlarged view illustrating area A of FIG. 6.

In FIG. 8, the display layer DPL includes the plurality of pixels PX and the plurality of optical sensors PS.

The plurality of pixels PX may include a plurality of emission portions EMA, such as first to third emission portions EMA1, EMA2, and EMA3 that emit light in the active region AAR (e.g., the display area). While an embodiment shown in FIG. 8 includes three emission portions EMA, embodiments of the present disclosure are not necessarily limited thereto and the number of the plurality of emission portions may vary. The plurality of emission portions EMA may be defined as areas in which the pixel electrode 170 is exposed by an opening of a bank layer BK in cross-sectional view, and may be defined as areas in which the exposed pixel electrode 170 and the light emitting layer 175 overlap.

The plurality of optical sensors PS may include a plurality of light sensing portions RA that sense light incident within the active region AAR (e.g., light sensing area). The light sensing portion RA may be defined as an area in which the first electrode 180 is exposed by the opening of the bank layer BK in cross-sectional view, and may be defined as an area in which the exposed first electrode 180 and the photoelectric conversion layer 185 overlap. Thus, the bank layer BK may partition the plurality of emission portions EMA and the plurality of light sensing portions RA.

A non-emission area is disposed between the emission portions EMA of each pixel PX. In addition, a non-sensing area is disposed between the light sensing portions RA of each optical sensor PS. In the present embodiment, an area in which the non-emission area and the non-sensing area overlap will be referred to as a peripheral portion NEA. A mesh pattern MSP is disposed in the peripheral portion NEA.

In an embodiment, the pixels PX may include a green pixel G, a red pixel R, and a blue pixel B. However, embodiments of the present disclosure are not necessarily limited thereto. The color pixels and the optical sensors PS may be arranged in various forms. In an embodiment, green pixels G and the optical sensors PS may be alternately arranged along the first direction X in a first row, and blue pixels B and red pixels R may be alternately arranged along the first direction X in a second row adjacent to the first row. The color pixels belonging to the first row may be alternately arranged in the first direction X with respect to the color pixels belonging to the second row. The number of the green pixels G in the first row may be twice the number of the red pixels R or blue pixels B in the second row. In addition, the number of the optical sensors PS in the first row may be twice the number of the red pixels R or the blue pixels B in the second row. The arrangement in the first row and the second row may be repeated up to an $n^{th}$ row. However, embodiments of the present disclosure are not necessarily limited thereto.

The size of the emission portion EMA of each color pixel may be different. In an embodiment in which the emission area of the green pixel G is referred to as a first emission portion EMA1, the emission area of the red pixel R is referred to as a second emission portion EMA2, and the emission area of the blue pixel B is referred to as a third emission portion, the size of the first emission portion EMA1 may be less than the size of the second emission portion EMA2 or the third emission portion EMA3.

Although the emission portion EMA of each color pixel is illustrated to have a rectangular shape, embodiments of the present disclosure are not necessarily limited thereto, and the shape of each emission portion EMA may be an octagon, a circle, a rhombus, another polygonal shape, etc.

The mesh pattern MSP may be disposed along the boundaries of the pixel PX and the optical sensor PS in the peripheral portion NEA. The mesh pattern MSP may not overlap the emission portion EMA and may partially overlap the light sensing portion RA. The width of the mesh pattern MSP may be less than the width of the peripheral portion NEA in one direction.

In an embodiment, mesh holes, such as first mesh holes MH1 and MH2 exposed by the mesh pattern MSP may have a substantially quadrangular shape. However, embodiments of the present disclosure are not necessarily limited thereto. For example, in an embodiment in which the shape of each emission portion EMA is an octagon, a circle, a rhombus, or another polygon, the shape of the first and second mesh holes MH1 and MH2 may also be an octagon, a circle, a rhombus, or another polygon, which is the same as the shape of each emission portion EMA.

The first and second mesh holes MH1 and MH2 may not overlap the emission portion EMA. The mesh holes may include first mesh holes MH1 and second mesh holes MH2.

The first mesh holes MH1 may respectively expose the plurality of emission portions EMA. For example, the area defined by the first mesh hole MH1 may include the emission portion EMA. The first mesh hole MH1 may overlap the light emitting layer 175 of the emission portion EMA and a portion of the bank layer BK. In an embodiment, the sizes (e.g., widths in a horizontal direction) of the first mesh holes MH1 may be the same, but may be different depending on the sizes of the emission portions EMA exposed by the corresponding first mesh holes MH1. For example, since the size of the first emission portion EMA1 is less than the size of the second emission portion EMA2, the size of the first mesh hole MH1 exposing the first emission portion EMA1 may be less than the size of the first mesh hole MH1 exposing the second emission portion EMA2.

The second mesh holes MH2 may overlap portions of the plurality of light sensing portions RA. The second mesh holes MH2 may respectively expose portions of the plurality of light sensing portions RA. For example, a partial area of the light sensing portion RA may overlap the second mesh hole MH2, and the remaining area of the light sensing portion RA may not overlap the second mesh hole MH2. The second mesh hole MH2 may overlap the photoelectric conversion layer 185 of the light sensing portion RA and a portion of the bank layer BK. In an embodiment, the sizes (e.g., widths in the horizontal direction) of the second mesh holes MH2 may be the same, but may be different depending on the sizes of the light sensing portions RA exposed by the corresponding second mesh holes MH2.

The mesh pattern MSP may be disposed closer to the light sensing portion RA than to the emission portion EMA. In addition, the mesh pattern MSP may overlap a portion of the light sensing portion RA. Accordingly, each of the light sensing portions RA may receive light incident on a small area to increase the resolution of an image sensed by the light sensing portion RA.

In an embodiment, the mesh pattern MSP may be disposed closer to the light sensing portion RA than to the emission portion EMA, and the mesh pattern MSP may overlap a portion of the light sensing portion RA. Accordingly, the resolution of the fingerprint sensing signal may be increased, and the accuracy of the fingerprint sensing signal provided by light reflected by the fingerprint may be increased.

The mesh pattern MSP may include the plurality of touch electrodes IE1 and IE2. In addition, the mesh holes MH1 and MH2 are defined between the plurality of touch electrodes IE1 and IE2 and may not overlap the plurality of touch electrodes IE1 and IE2.

This embodiment may also be applied to an embodiment in which the touch sensing layer TSL is formed in a planar pattern. In this embodiment, the mesh pattern MSP may be referred to as the touch electrodes IE1 and IE2, and the first mesh hole MH1 and the second mesh hole MH2 may be referred to as a first hole and a second hole.

Figure 9:
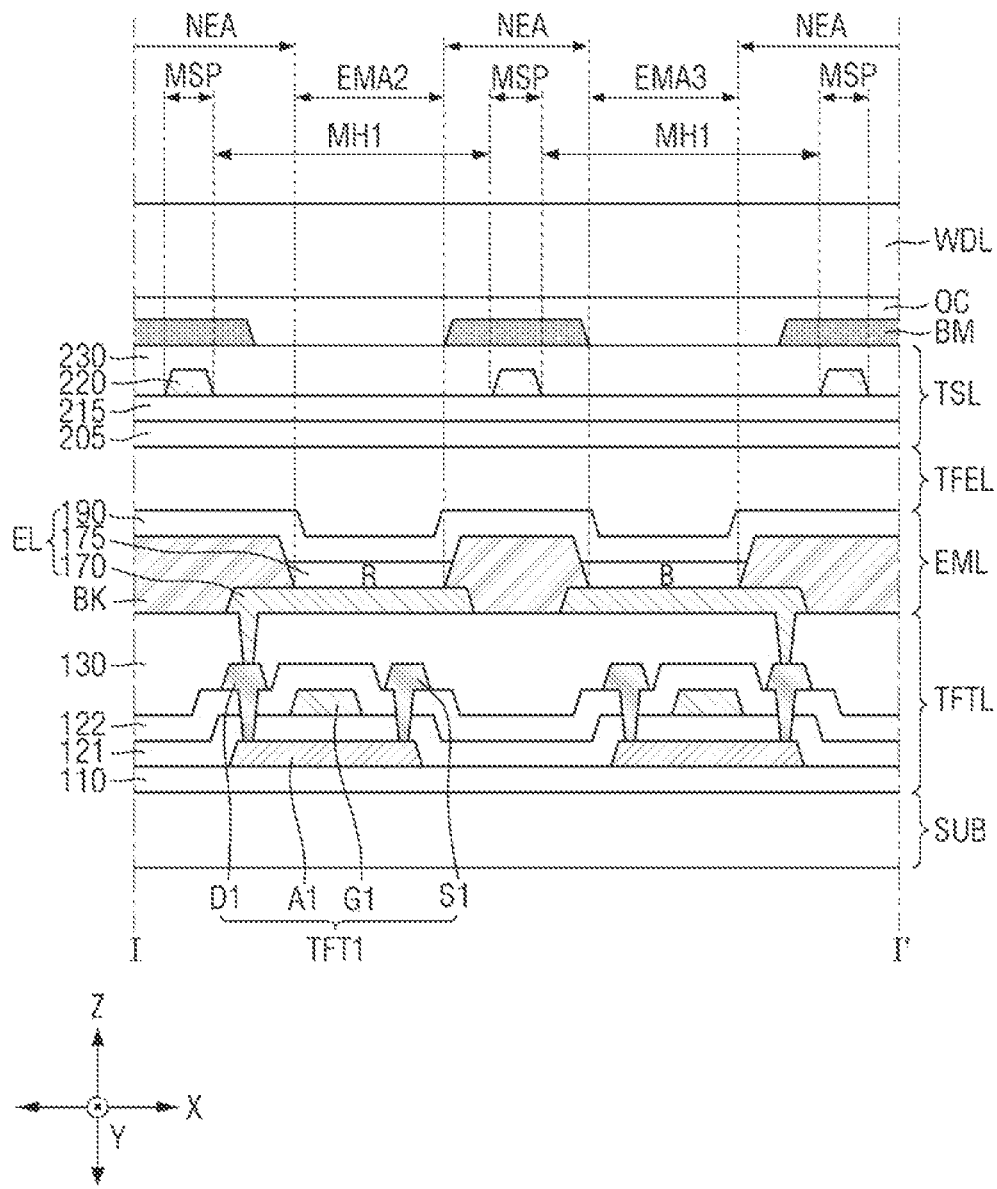
FIG. 9 is a cross-sectional view illustrating the display device taken along line I-I' of FIG. 8 according to an embodiment of the present disclosure.

FIG. 9 is a cross-sectional view illustrating an example of the display device taken along line I-I' of FIG. 8. FIG. 10 is a cross-sectional view illustrating an example of the display device taken along line II-II' of FIG. 8.

Referring to FIGS. 9 and 10, a buffer layer 110 is disposed on the substrate SUB. In an embodiment, the buffer layer 110 may include silicon nitride, silicon oxide, silicon oxynitride, or the like. However, embodiments of the present disclosure are not necessarily limited thereto.

A first thin film transistor TFT1 and a second thin film transistor TFT2 may be disposed on the buffer layer 110.

The plurality of thin film transistors TFT1 and TFT2 may include semiconductor layers A1 and A2, a gate insulating layer 121 disposed on a portion of the semiconductor layers A1 and A2, gate electrodes G1 and G2 on the gate insulating layer 121, an interlayer insulating layer 122 covering each of the semiconductor layers A1 and A2 and each of the gate electrodes G1 and G2, and source electrodes S1 and S2 and drain electrodes D1 and D2 on the interlayer insulating layer 122, respectively.

The semiconductor layers A1 and A2 may form channels of the first thin film transistor TFT1 and the second thin film transistor TFT2, respectively. In an embodiment, the semiconductor layers A1 and A2 may include polycrystalline silicon. However, embodiments of the present disclosure are not necessarily limited thereto. For example, in an embodiment, the semiconductor layers A1 and A2 may include monocrystalline silicon, low-temperature polycrystalline silicon, amorphous silicon, or an oxide semiconductor. The oxide semiconductor may include, for example, a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like. Each of the semiconductor layers A1 and A2 may include a channel region and a source region and a drain region doped with impurities.

The gate insulating layer 121 is disposed on the semiconductor layers A1 and A2. The gate insulating layer 121 electrically insulates the first gate electrode G1 from the first semiconductor layer A1 and electrically insulates the second gate electrode G2 and the second semiconductor layer A2. In an embodiment, the gate insulating layer 121 may be made of an insulating material, for example, silicon oxide (SiOx), silicon nitride (SiNx), metal oxide, or the like. However, embodiments of the present disclosure are not necessarily limited thereto.

The first gate electrode G1 of the first thin film transistor TFT1 and the second gate electrode G2 of the second thin film transistor TFT2 are disposed on the gate insulating layer 121. The gate electrodes G1 and G2 may be formed on top of the channel region of the semiconductor layers A1 and A2, such as on the gate insulating layer 121, respectively, at a position overlapping the channel region.

An interlayer insulating layer may be disposed on the gate electrodes G1 and G2. The interlayer insulating layer 122 may include an inorganic insulating material such as silicon oxide (SiOx), silicon nitride (SiNx), silicon oxynitride, hafnium oxide, aluminum oxide, or the like. In addition, in an embodiment the interlayer insulating layer 122 may be formed of a plurality of insulating layers, and may further include a conductive layer forming the second capacitor electrode between the insulating layers.

The source electrodes S1 and S2 and the drain electrodes D1 and D2 are disposed on the interlayer insulating layer 122. The first source electrode S1 of the first thin film transistor TFT1 may be electrically connected to the drain region of the first semiconductor layer A1 through a contact hole penetrating the interlayer insulating layer 122 and the gate insulating layer 121. The second source electrode S2 of the second thin film transistor TFT2 may be electrically connected to the drain region of the second semiconductor layer A2 through a contact hole penetrating the interlayer insulating layer 122 and the gate insulating layer 121. In an embodiment, each of the source electrodes S1 and S2 and the drain electrodes D1 and D2 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). However, embodiments of the present disclosure are not necessarily limited thereto.

A planarization layer 130 may be formed on the interlayer insulating layer 122 to cover each of the source electrodes S1 and S2 and the drain electrodes D1 and D2. The planarization layer 130 may be formed of an organic insulating material or the like. The planarization layer may have a flat surface and may include a contact hole exposing one of the source electrodes S1 and S2 and the drain electrodes D1 and D2.

The light emitting element layer EML may be disposed on the planarization layer 130. The light emitting element layer EML may include the light emitting element EL, the photoelectric conversion element PD, and the bank layer BK. The light emitting element EL may include the pixel electrode 170, the light emitting layer 175, and the common electrode 190, and the photoelectric conversion element PD may include the first electrode 180, the photoelectric conversion layer 185, and the common electrode 190.

The pixel electrode 170 of the light emitting element EL may be disposed on the planarization layer 130. The pixel electrode 170 may be provided for each pixel PX. The pixel electrode 170 may be connected to the first source electrode S1 or the first drain electrode D1 of the first thin film transistor TFT1 through a contact hole passing through the planarization layer 130.

In an embodiment, the pixel electrode 170 of the light emitting element EL may have a single-layer structure of molybdenum (Mo), titanium (Ti), copper (Cu) or aluminum (Al), or may have a stacked-layer structure, for example, multiple layers of ITO/Mg, ITO/MgF, ITO/Ag, and ITO/Ag/ITO including indium-tin-oxide (ITO), indium-zinc-oxide (IZO), zinc oxide (ZnO), indium oxide ($In_2O_3$) and silver (Ag), magnesium (Mg), aluminum (Al), platinum (Pt), lead (Pb), gold (Au), or nickel (Ni). However, embodiments of the present disclosure are not necessarily limited thereto.

The first electrode 180 of the photoelectric conversion element PD may be disposed on the planarization layer 130. The first electrode 180 may be provided for each optical sensor PS. The first electrode 180 may be connected to the second source electrode S2 or the second drain electrode D2 of the second thin film transistor TFT2 through a contact hole passing through the planarization layer 130.

In an embodiment, the first electrode 180 of the photoelectric conversion element PD may have a single-layer structure of molybdenum (Mo), titanium (Ti), copper (Cu), or aluminum (Al), or may have a multilayer structure of ITO/Mg, ITO/MgF, ITO/Ag, and ITO/Ag/ITO. However, embodiments of the present disclosure are not necessarily limited thereto.

The bank layer BK may be disposed on the pixel electrode 170 and the first electrode 180. The bank layer BK may be formed in an area overlapping the pixel electrode 170 to form an opening exposing the pixel electrode 170. A region in which the exposed pixel electrode and the light emitting layer 175 overlap each other may be defined as one of the first to third emission portions EMA1, EMA2, and EMA3 depending on the color pixel R, G, B included in each pixel PX.

In addition, the bank layer BK may be formed in an area overlapping the first electrode to form an opening exposing the first electrode 180. The opening exposing the first electrode 180 may provide a space in which the photoelectric conversion layer 185 of each optical sensor PS is formed, and the area in which the exposed first electrode 180 and the photoelectric conversion layer 185 overlap may be defined as the light sensing portion RA.

In an embodiment, the bank layer BK may include an organic insulating material such as acrylic resin, epoxy resin, phenolic resin, polyamide resin, polyimide resin, unsaturated polyester resin, polyphenylene resin, polyphenylenesulfide resin or benzocyclobutene (BCB). However, embodiments of the present disclosure are not necessarily limited thereto. For example, in an embodiment the bank layer BK may include an inorganic material such as silicon nitride.

The light emitting layer 175 may be disposed on the pixel electrode 170 of the light emitting element EL exposed by the opening of the bank layer BK. In an embodiment, the light emitting layer 175 may include a high molecular material or a low molecular material, and may emit red, green, or blue light for each color pixel R, G, B included in each pixel PX. The light emitted from the light emitting layer 175 may contribute to image display or function as a light source incident on the optical sensor PS. For example, a light source having a green wavelength emitted from the first emission portion EMA1 of the green pixel G may function as a light source incident on the light sensing portion RA of the optical sensor PS.

In an embodiment in which the light emitting layer 175 is formed of an organic material, a hole injecting layer HIL and a hole transporting layer HTL may be disposed on the lower portion of each light emitting layer 175 as a center, and an electron injecting layer EIL and an electron transporting layer ETL may be stacked on the upper portion thereof. The layers may be single-layered or multi-layered with organic materials.

The photoelectric conversion layer 185 may be disposed on the first electrode 180 of the photoelectric conversion element PD exposed by the opening of the bank layer BK. The photoelectric conversion layer 185 may generate photocharges in proportion to incident light. The incident light may also be light emitted from the light emitting layer 175 and then reflected to enter the photoelectric conversion layer 185, or may also be external light provided from the outside regardless of the light emitting layer 175. Electric charges generated and accumulated in the photoelectric conversion layer 185 may be converted into electrical signals required for sensing.

The photoelectric conversion layer 185 may include an electron donating material and an electron accepting material. The electron donating material may generate donor ions in response to light, and the electron accepting material may generate acceptor ions in response to light. In an embodiment in which the photoelectric conversion layer 185 is formed of an organic material, the electron donating material may include a compound such as subphthalocyanine (SubPc) or dibutylphosphate (DBP). However, embodiments of the present disclosure are not necessarily limited thereto. In an embodiment, the electron accepting material may include a compound such as fullerene, a fullerene derivative, or perylene diimide. However, embodiments of the present disclosure are not necessarily limited thereto.

Alternatively, in an embodiment in which the photoelectric conversion layer 185 is formed of an inorganic material, the photoelectric conversion element PD may be a pn-type or pin-type phototransistor. For example, the photoelectric conversion layer 185 may have a structure in which an N-type semiconductor layer, an I-type semiconductor layer, and a P-type semiconductor layer are sequentially stacked.

In an embodiment in which the photoelectric conversion layer 185 is formed of an organic material, the hole injecting layer HIL and the hole transporting layer HTL may be disposed on the lower portion of each photoelectric conversion layer 185 as a center, and the electron injecting layer EIL and the electron transporting layer ETL may be stacked on the upper portion thereof. The layers may be single-layered or multi-layered with organic materials.

In an embodiment, the light sensing portion RA may be an area receiving light having the same wavelength as that of the light emitted from the first emission portion EMA1 of the adjacent green pixel G serving as a light source. However, embodiments of the present disclosure are not necessarily limited thereto.

In the present specification, the regions in which the light emitting layer 175 and the photoelectric conversion layer 185 are disposed are illustrated to be substantially the same as the emission portion EMA and the light sensing portion RA, respectively. However, in some embodiments the light emitting layer 175 may be disposed to cover the bank layer BK beyond the emission portion EMA, and the photoelectric conversion layer 185 may be disposed to cover the bank layer BK beyond the light sensing portion RA.

The common electrode 190 may be disposed on the light emitting layer 175, the photoelectric conversion layer 185, and the bank layer BK. In an embodiment, the common electrode 190 may be disposed over the entirety of the plurality of pixels PX and the plurality of optical sensors PS to cover the light emitting layer 175, the photoelectric conversion layer 185, and the bank layer BK. In an embodiment, the common electrode 190 may include a conductive material having a low work function, for example, Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg, etc.). Alternatively, the common electrode 173 may include a transparent metal oxide, for example, indium-tin-oxide (ITO), indium-zinc-oxide (IZO), zinc oxide (ZnO) or the like. However, embodiments of the present disclosure are not necessarily limited thereto.

Although not necessarily limited to the following, the photoelectric conversion element PD and the light emitting element EL may share the common electrode 190 disposed on the photoelectric conversion layer 185 and the light emitting layer 175.

The encapsulation layer TFEL may be disposed on the light emitting element layer EML. In an embodiment, the encapsulation layer TFEL may include at least one inorganic layer to prevent oxygen or moisture from permeating each of the light emitting layer 175 and the photoelectric conversion layer 185. In addition, the encapsulation layer TFEL may include at least one organic layer to protect each of the light emitting layer 175 and the photoelectric conversion layer 185 from foreign substances such as dust. For example, the encapsulation layer TFEL may be formed in a structure in which a first inorganic layer, an organic layer, and a second inorganic layer are sequentially stacked (e.g., in the third direction Z). The first inorganic layer and the second inorganic layer may be formed as a multilayer in which one or more inorganic layers selected from a silicon nitride layer, a silicon oxynitride layer, a silicon oxide layer, a titanium oxide layer, and an aluminum oxide layer are alternately stacked. In an embodiment, the organic layer may be an organic layer such as acrylic resin, epoxy resin, phenolic resin, polyamide resin, or polyimide resin. However, embodiments of the present disclosure are not necessarily limited thereto.

The base layer 205, the first touch insulating pattern 215, the touch pattern 220, and the second touch insulating layer 230 of the touch sensing layer TSL may be sequentially disposed on the encapsulation layer TFEL (e.g., in the third direction Z). FIGS. 9 and 10 are cross-sectional views of a sensor portion, so the first touch conductive layer 210 is not illustrated in the corresponding cross-sectional views. in an embodiment, the layout of the first touch conductive layer 210 including the first connection portion CP1 may be the same as the layout of the touch pattern 220.

The first touch insulating pattern 215 may overlap the bank layer BK and the plurality of emission portions EMA, such as the first to third emission portions EMA1 to EMA3. In addition, the first touch insulating pattern 215 may overlap a portion of the light sensing portion RA. The cross-sectional shape of the first touch insulating pattern 215 may be a reverse tapered shape with a width that becomes narrower towards the top surface of the substrate SUB.

The touch pattern 220 may be disposed on the first touch insulating pattern 215. The touch pattern 220 may be disposed on one side of the first touch insulating pattern 215. For example, the touch pattern 220 may be disposed on the top surface and the side surface of the first touch insulating pattern 215. A detailed description thereof will be given later with reference to FIGS. 11 and 12.

The touch pattern 220 may be disposed in the peripheral portion NEA while overlapping the bank layer BK. The touch pattern 220 constitutes the mesh pattern MSP of the touch electrodes IE1 and IE2 and may not overlap the emission portion EMA, such as the first to third emission portions EMA1, EMA2, EMA3. In addition, the touch pattern 220 may partially overlap the light sensing portion RA. Accordingly, the touch pattern 220 may not be visually recognized by the user without disturbing the light emission. In addition, the touch pattern 220 may not be disposed in the first mesh hole MH1 and the second mesh hole MH2.

The first mesh hole MH1 may overlap (e.g., partially overlap) the bank layer BK existing in the peripheral portion NEA. In addition, the first mesh hole MH1 may overlap the emission portion EMA. The second mesh hole MH2 may overlap the light sensing portion RA.

In the present embodiment, the mesh pattern MSP may be disposed closer to the light sensing portion RA than to the emission portion EMA. For example, a distance between the mesh pattern MSP and the light sensing portion RA may be less than a distance between the mesh pattern MSP and the emission portion EMA. A description of the touch pattern 220 will be given later with reference to FIGS. 11 and 12.

A light blocking member BM may be disposed on the touch sensing layer TSL. The light blocking member BM may use a material that blocks light emitted from the emission portion EMA. For example, in an embodiment the light blocking member BM may form a black matrix by using a material that absorbs visible light, such as a metal material, or a resin material including a pigment (e.g., carbon black or the like) or dye. For another example, the light blocking member BM may have a stacked structure of a red color filter, a green color filter, and a blue color filter. Accordingly, the light blocking member BM may prevent color mixing between color pixels included in each pixel PX.

The light blocking member BM may be covered with an overcoat layer OC. The overcoat layer OC may be a material having excellent light transmittance. The overcoat layer OC may planarize a top portion of the light blocking member BM. In an embodiment, the overcoat layer OC may be made of an acrylic epoxy material. However, embodiments of the present disclosure are not necessarily limited thereto. In addition, in an embodiment the light blocking member BM may be covered with a color filter.

A window WDL may be disposed on the overcoat layer OC. The window WDL may be a protective member disposed on the overcoat layer OC to protect the components of the display device 1. In an embodiment, the window WDL may be made of glass or plastic. In an embodiment in which the window WDL contains glass, an ultra thin glass (UTG) with a thickness of about 0.1 mm or less may be applied to provide a flexible property. In addition, in an embodiment a polarizing plate may be disposed between the window WDL and the overcoat layer OC, and a transparent adhesive member may also be disposed therebetween.

As will be described later, even in the present embodiment, the area of light incident on the light sensing portion RA may be reduced by the touch pattern 220 of the touch sensing layer TSL, and light incident toward the light sensing portion RA may be reflected by the touch pattern 220. For example, the touch pattern 220 may detect the light incident on the light sensing portion RA to accurately identify the user's fingerprint.

Figure 11:
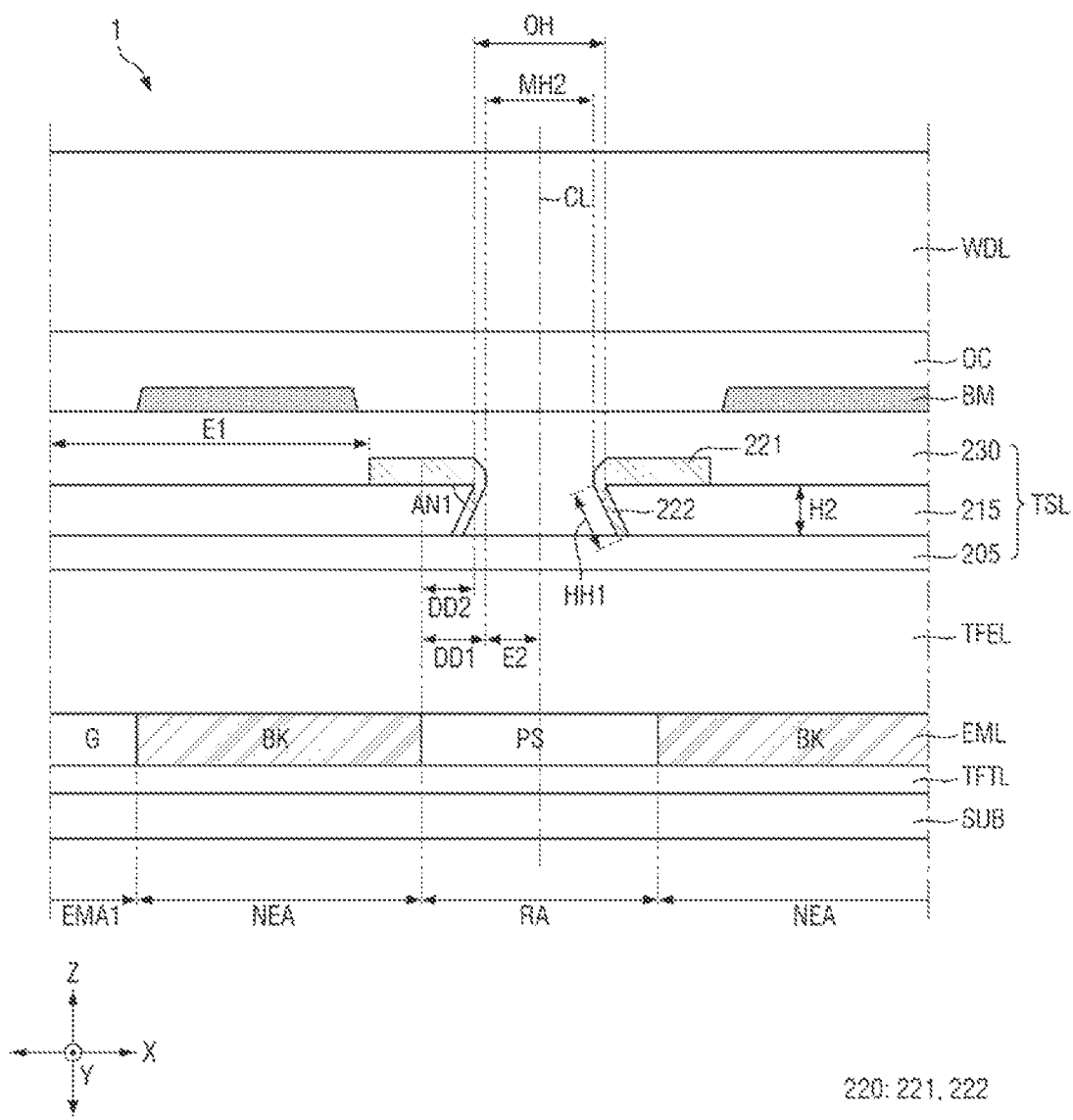
FIG. 11 is a cross-sectional view illustrating a touch pattern according to an embodiment of the present disclosure.
Figure 12:
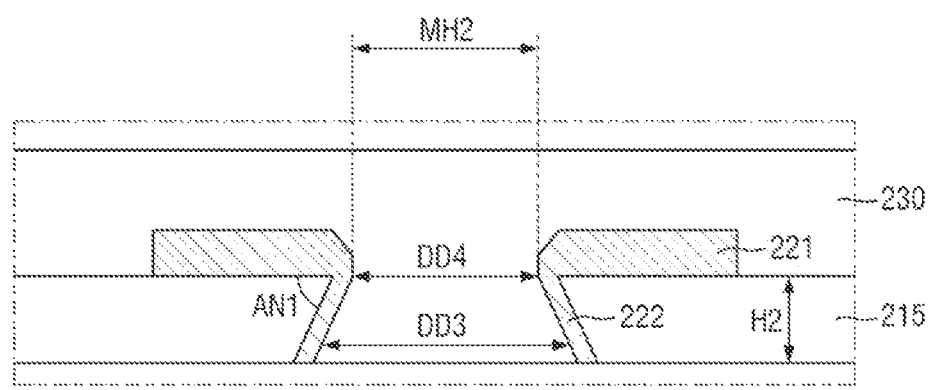
FIG. 12 is an enlarged view of a touch pattern according to an embodiment of the present disclosure.

FIG. 11 is a cross-sectional view illustrating a touch pattern according to an embodiment. FIG. 12 is an enlarged view of a touch pattern according to an embodiment.

Referring to FIGS. 11 and 12, as described above, the first touch insulating pattern 215 may overlap the bank layer BK and the plurality of emission portions EMA, such as the first to third emission portions EMA1 to EMA3. In addition, the first touch insulating pattern 215 may overlap a portion of the light sensing portion RA. For example, the first touch insulating pattern may overlap the light sensing portion RA by a second width DD2. In an embodiment, the first touch insulating pattern 215 may overlap the light sensing portion RA symmetrically with respect to a central line CL. Accordingly, the first touch insulating pattern 215 may partition a light opening OH in which the light sensing portion RA and the first touch insulating pattern 215 do not overlap.

In an embodiment, the cross-sectional shape of the first touch insulating pattern 215 may be a reverse tapered shape with a width that becomes narrower in a direction towards the top surface of the substrate SUB. For example, an angle between the top surface of the first touch insulating pattern 215 and the side surface of the first touch insulating pattern 215 may be an acute angle. In an embodiment in which the first touch insulating pattern 215 includes a first reverse tapered surface adjacent to the light opening OH, and the inclination angle of the first reverse tapered surface is defined as a first reverse taper angle AN1, the first reverse taper angle AN1 may be in a range of about 65 degrees to about 90 degrees.

Accordingly, the light opening OH may be partitioned along the reverse tapered shape of the first touch insulating pattern 215. For example, the light opening OH may overlap the light sensing portion RA. The cross-sectional shape of the light opening OH may be a tapered shape with a width that becomes wider in a direction towards the top surface of the substrate SUB. Accordingly, light may be incident through the light opening OH, and the light sensing portion RA may sense the incident light.

The touch pattern 220 may be disposed on (e.g., disposed directly thereon) the first touch insulating pattern 215. The touch pattern 220 may be disposed on one side of the first touch insulating pattern 215. For example, the touch pattern 220 may be disposed on the top surface and the side surface of the first touch insulating pattern 215. In addition, the touch pattern 220 may be disposed to overlap the light opening OH. For example, as shown in an embodiment of FIG. 11, the touch pattern 220 may overlap a portion of the light opening OH on the first touch insulating pattern 215.

In the present embodiment, the touch pattern 220 may be referred to as the touch electrodes, such as the first and second touch electrodes IE1 and IE2, or may be referred to as the mesh pattern MSP. In addition, the touch pattern 220 may be an electrode that performs substantially the same role as that of the first and second touch electrodes IE1 and IE2. Hereinafter, the touch pattern 220 will be described.

The touch pattern 220 may be disposed adjacent to the light sensing portion RA. Accordingly, a first distance E1 between the touch pattern 220 and the center of the first emission portion EMA1 may be greater than a second distance E2 between the touch pattern 220 and the center of the light sensing portion RA. In addition, the second distance E2 between the touch pattern 220 and the center of the light sensing portion RA may be less than the width of the light sensing portion RA. For example, the touch pattern 220 may be disposed to overlap the light sensing portion RA. In an embodiment, a ratio of the width of the light sensing portion RA to the second distance E2 may be in a range of about 1.8 to about 2.

The touch pattern 220 includes a first touch pattern 221 and a second touch pattern 222. As the first touch pattern 221 and the second touch pattern 222 are disposed on the first touch insulating pattern 215, the side surface of the light opening OH may be formed of the first touch pattern 221 and the second touch pattern 222. In addition, since the first touch insulating pattern 215 has a reverse tapered shape, the side surface of the light opening OH may have a tapered shape.

The first touch pattern 221 may be disposed on (e.g., disposed directly on in the third direction Z) the top surface of the first touch insulating pattern 215. The first touch pattern 221 may protrude further in at least one direction (e.g., the first and/or second directions X, Y) towards a central portion of the light opening OH, such as the central line CL, than the side surface of the first touch insulating pattern 215. For example, the first touch pattern 221 may be disposed to overlap the top surface of the first touch insulating pattern 215 and the light opening OH. For example, the first touch pattern 221 may overlap the light sensing portion RA by a first width DD1. The first touch pattern 221 may overlap the light sensing portion RA symmetrically with respect to the central line CL.

Accordingly, the first touch pattern 221 may partition the second mesh hole MH2. In an embodiment shown in FIG. 11 in which the first touch pattern 221 is disposed to protrude more towards the light opening OH than the first touch insulating pattern 215, the width of the second mesh hole MH2 partitioned by the first touch pattern 221 may be less than the width of the light opening OH. For example, in an embodiment in which the width of the light sensing portion RA is about 7 µm, the width of the second mesh hole MH2 may be about 3.5 µm or less. Alternatively, in an embodiment in which the width of the light sensing portion RA is about 7 µm, the width of the second mesh hole MH2 may be about 4.06 µm or less. In this embodiment, the first touch pattern 221 may partition the width of the second mesh hole MH2 regardless of the width of the light opening OH partitioned by the first touch insulating pattern 215. Accordingly, by forming the width of the second mesh hole MH2 to be less than the width of the light sensing portion RA, the amount of light incident on the light sensing portion RA may be adjusted.

Referring further to FIG. 12, the second touch pattern 222 may be disposed on (e.g., disposed directly thereon) the side surface of the first touch insulating pattern 215. The second touch pattern 222 may be disposed in direct contact with the side surface of the first touch insulating pattern 215. For example, in an embodiment the second touch pattern 222 may cover an entirety of the side surface of the first touch insulating pattern 215. Accordingly, the cross-sectional shape of the second touch pattern 222 may have an opening width that becomes greater in a direction towards the top surface of the substrate SUB. For example, a third opening width DD3 of the second touch pattern 222 (e.g., a width between the second touch pattern 222 on opposing sides of the side surface of the first touch insulating pattern 215) adjacent to the base layer 205 may become greater in a direction towards the top surface of the base layer 205. Accordingly, a fourth opening width DD4 of the second touch pattern 222 adjacent to the first touch pattern 221 may be less than the third opening width DD3. For example, the second touch pattern 222 may be disposed along a tapered shape.

In an embodiment, the second touch pattern 222 may be disposed to cover the entire side surface of the first touch insulating pattern 215. The second touch pattern 222 may be disposed along the first reverse taper angle AN1. Accordingly, a first length HH1 of the second touch pattern 222 may be greater than a thickness H2 of the first touch insulating pattern 215 (e.g., length in the third direction Z).

In an embodiment, the first touch pattern 221 and the second touch pattern 222 may be directly connected to each other. For example, in an embodiment the first touch pattern 221 and the second touch pattern 222 may be integrally formed and electrically connected to each other. However, embodiments of the present disclosure are not necessarily limited thereto, and the second touch pattern 222 may be disposed to be spaced apart from the first touch pattern 221 on the first touch insulating pattern 215 in some embodiments. This will be described later with reference to FIGS. 13 to 15.

Figure 13:
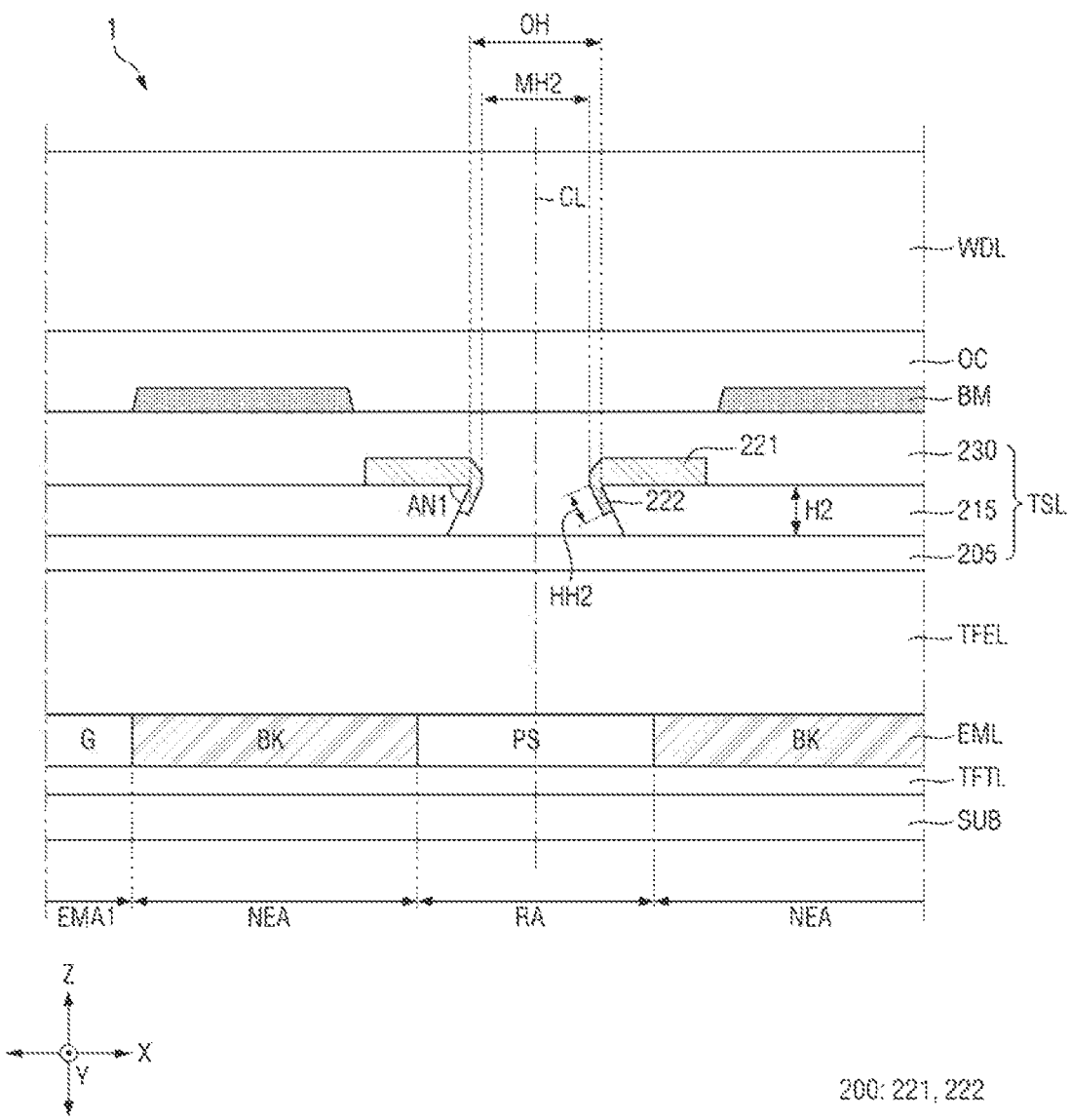
FIGS. 13 to 15 are cross-sectional views illustrating a touch pattern according to embodiments of the present disclosure.
Figure 14:
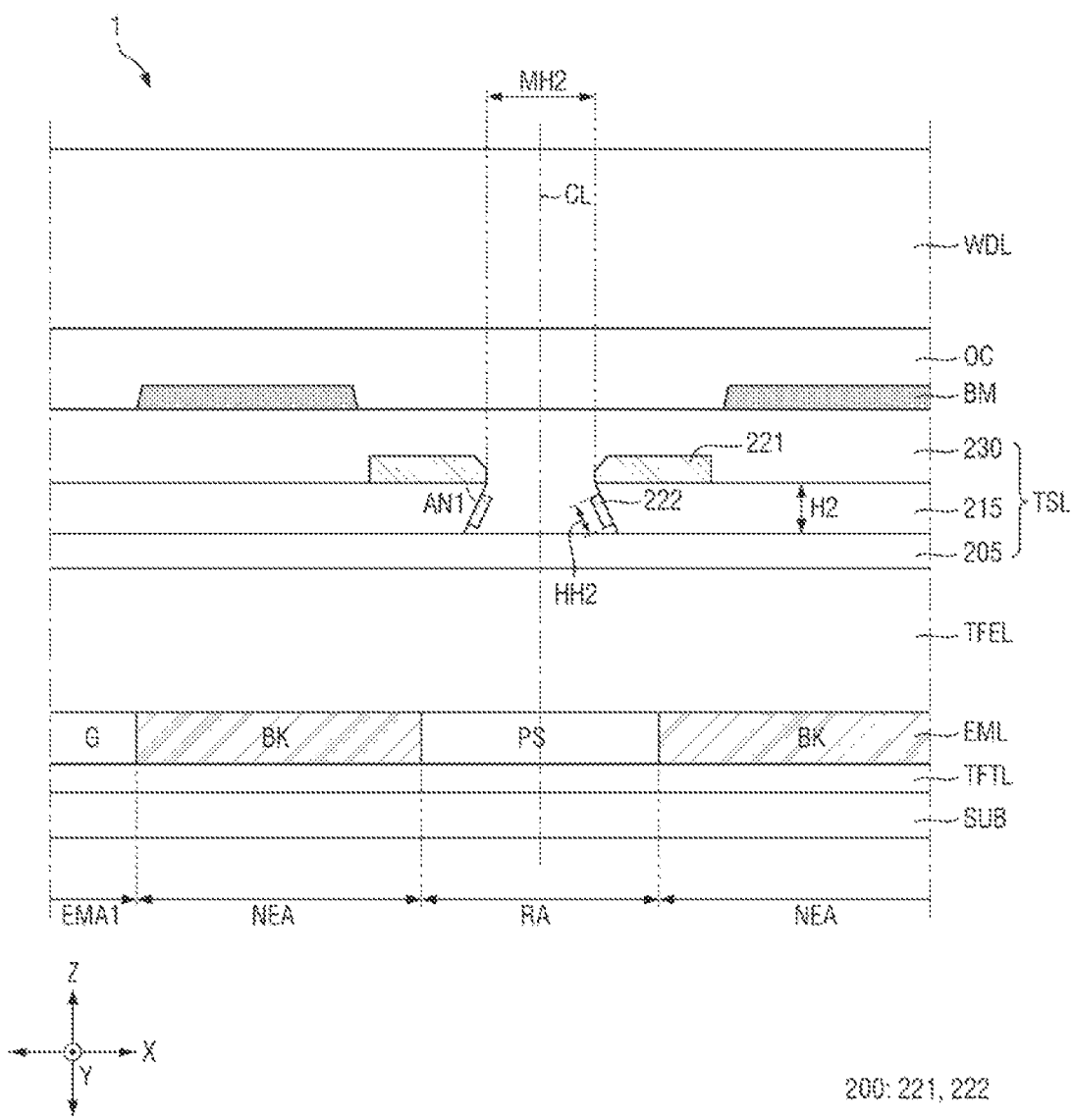
Figure 15:
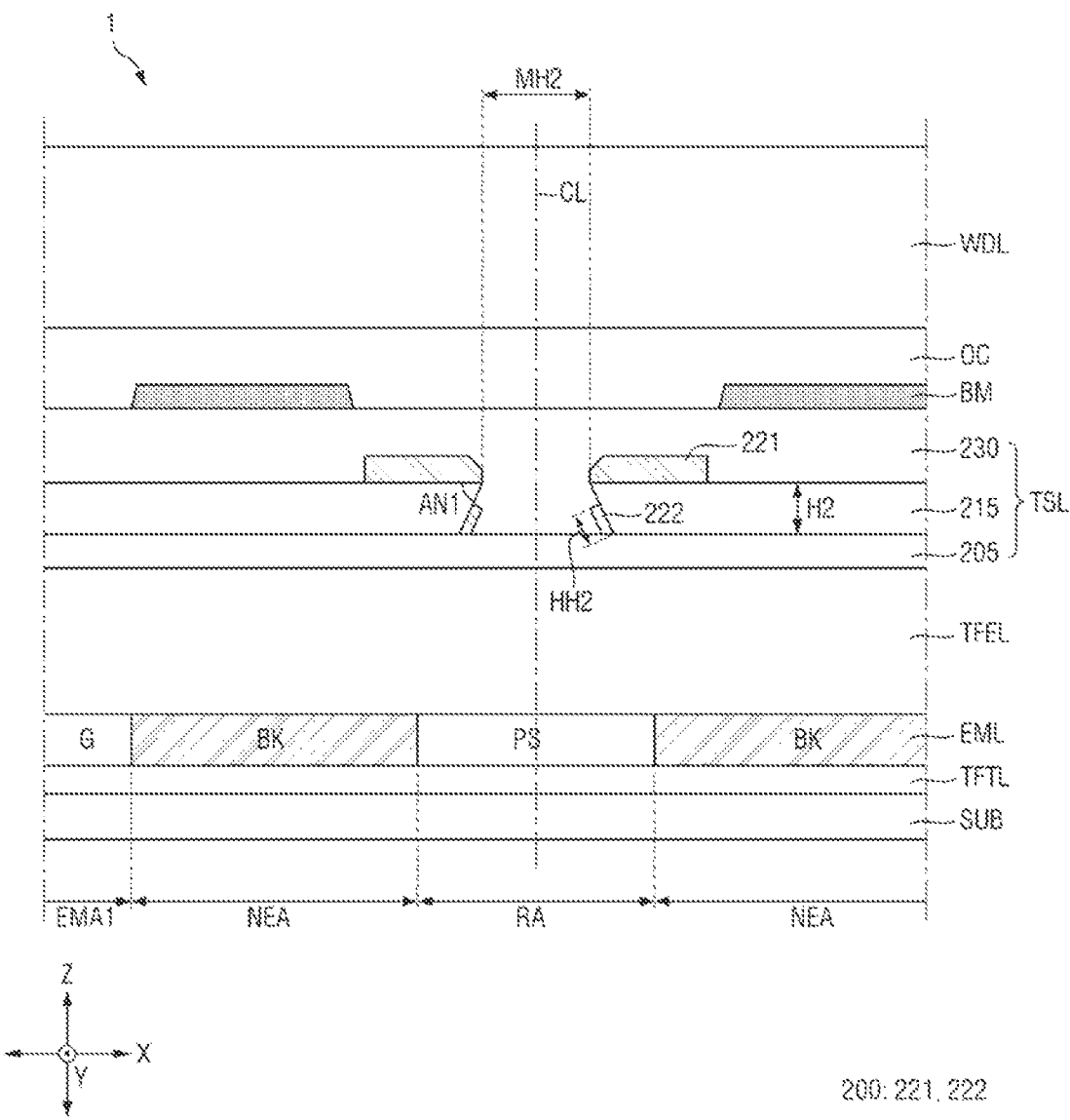

FIGS. 13 to 15 are cross-sectional views illustrating a touch pattern according to embodiments of the present disclosure.

Embodiments of FIGS. 13 to 15 are substantially the same as an embodiment of FIG. except for the second touch pattern 222. Hereinafter, the embodiment of FIGS. 13 to 15 will be described focusing on differences from the embodiment of FIG. 11 and a repeated description of similar or identical elements may be omitted for economy of description.

Referring to FIGS. 13 to 15, the base layer 205, the first touch insulating pattern 215, the touch pattern 220, and the second touch insulating layer 230 of the touch sensing layer TSL may be sequentially arranged on the encapsulation layer TFEL. FIGS. 13 to 15 are cross-sectional views of the sensor portion, so the first touch conductive layer 210 is not shown in the corresponding cross-sectional views. The layout of the first touch conductive layer 210 including the first connection portion CP1 may be the same as the layout of the touch pattern 220.

Referring to FIG. 13, the second touch pattern 222 may be disposed on the side surface of the first touch insulating pattern 215. The second touch pattern 222 may be disposed in direct contact with the side surface of the first touch insulating pattern 215. Accordingly, the cross-sectional shape of the second touch pattern 222 may have a width that becomes wider in a direction towards the top surface of the substrate SUB. For example, the third opening width DD3 of the second touch pattern 222 adjacent to the base layer 205 may become greater towards the top surface of the base layer 205. Accordingly, the fourth opening width DD4 of the second touch pattern 222 adjacent to the first touch pattern 221 may be less than the third opening width DD3. For example, the second touch pattern 222 may be disposed along a tapered shape.

In an embodiment, the first touch pattern 221 and the second touch pattern 222 may be directly connected to each other. For example, in an embodiment the first touch pattern 221 and the second touch pattern 222 may be integrally formed and electrically connected to each other.

The second touch pattern 222 may be disposed to cover only a portion of the side surface of the first touch insulating pattern 215. For example, the second touch pattern 222 may cover an uppermost portion of the side surface of the first touch insulating pattern 215. The second touch pattern 222 may be disposed along the first reverse taper angle AN1. In this embodiment, a second length HH2 of the second touch pattern 222 may be less than the thickness H2 of the first touch insulating pattern 215 (e.g., length in the third direction Z). Even if the second length HH2 of the second touch pattern 222 is less than the thickness H2 of the first touch insulating pattern 215, the light incident through the light opening OH may be reflected toward the light sensing portion RA.

In addition, referring to embodiments of FIGS. 14 and 15, the second touch pattern 222 may be disposed to be spaced apart from the first touch pattern 221. For example, the second touch pattern 222 may be disposed to cover only a portion of the side surface of the first touch insulating pattern 215. For example, the second touch pattern 222 may cover a middle portion of the side surface of the first touch insulating pattern as shown in FIG. 14 or a lowermost portion of the side surface of the first touch insulating pattern as shown in FIG. 15. The second touch pattern 222 may be disposed along the first reverse taper angle AN1. In this embodiment, the second length HH2 of the second touch pattern 222 may be less than the thickness H2 of the first touch insulating pattern 215. Even if the second length HH2 of the second touch pattern is less than the thickness H2 of the first touch insulating pattern 215, the light incident through the light opening OH may be reflected toward the light sensing portion RA.

The second touch pattern 222 may be disposed to be spaced apart from the first touch pattern 221. The second touch pattern 222 may be spaced apart from the first touch pattern 221 and may not be electrically connected thereto. Even if the second touch pattern 222 is disposed to be spaced apart from the first touch pattern 221, the light incident through the light opening OH may be reflected toward the light sensing portion RA.

Even in embodiments shown in FIGS. 14-15, since the first touch pattern 221 forms the second mesh hole MH2, the area of the light incident on the light sensing portion RA may be reduced, and since the second touch pattern 222 is formed at the first reverse taper angle AN1, the light incident through the light opening OH may be reflected toward the light sensing portion RA.

Figure 16:
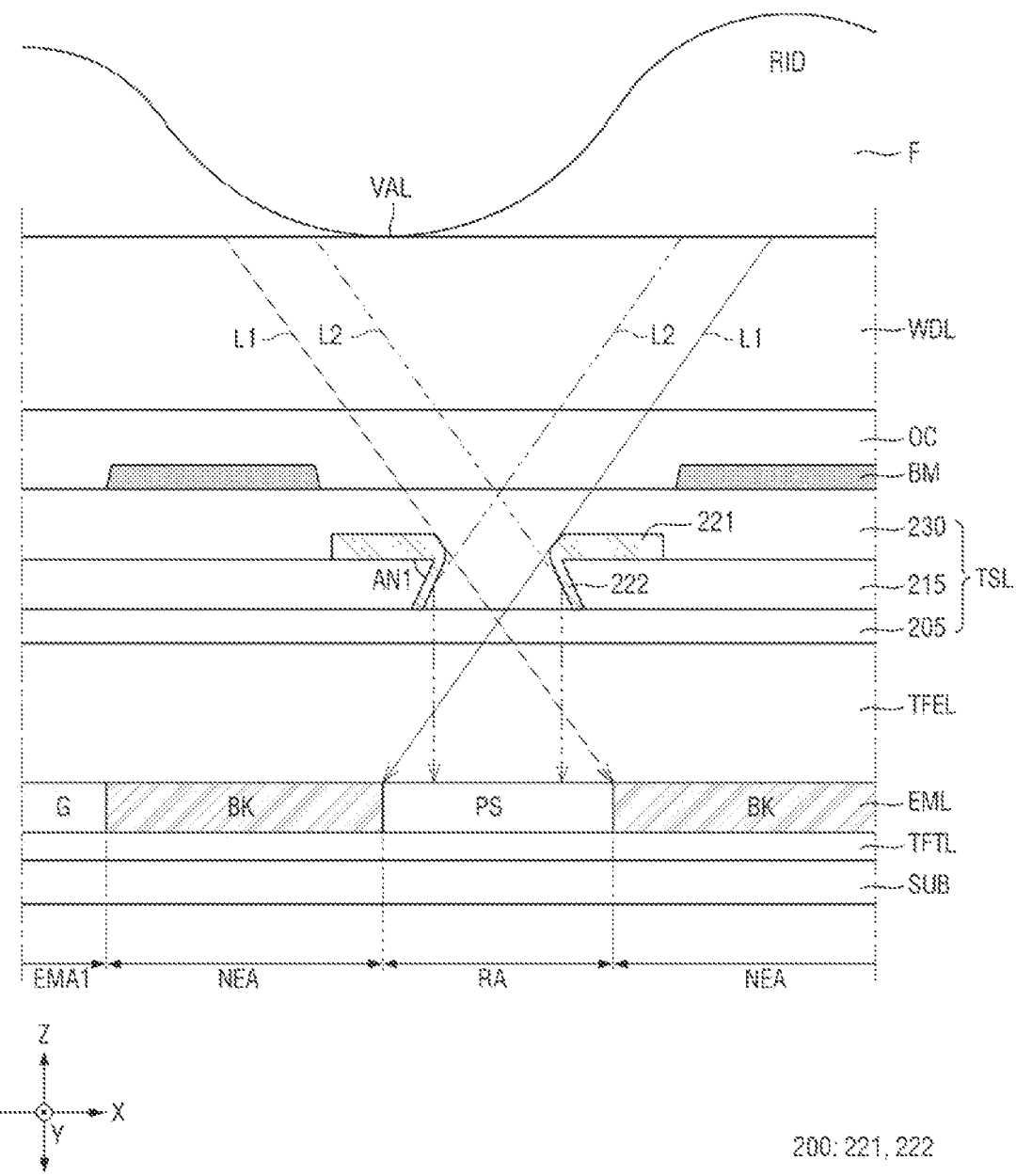
FIG. 16 is a cross-sectional view obtained by reflecting light incident on an optical sensor according to an embodiment of the present disclosure.

FIG. 16 is a cross-sectional view obtained by reflecting light incident on an optical sensor according to an embodiment.

With reference to FIG. 16, first and second lights L1 and L2 incident on the light sensing portion RA through the first touch pattern 221 and the second touch pattern 222 will be described.

Referring to FIG. 16, a fingerprint F of a finger is composed of ridges RID having a specific pattern and valleys VAL between the ridges RID. In a state in which the fingerprint F is in direct contact with the top surface of the window WDL, the ridges RID of the fingerprint F are in direct contact with the top surface of the window WDL, whereas the valleys VAL of the fingerprint F are not in direct contact with the window WDL. For example, the top surface of the window WDL is in direct contact with the air (e.g., external environment) at the valley VAL portion.

When the fingerprint F is in direct contact with the top surface of the window WDL, light outputted from emission portions EMA of the pixels PX may be reflected from the ridge RID and the valley VAL of the fingerprint F. In this embodiment, since the refractive index of the fingerprint F and the refractive index of the air are different, the amount of the light reflected from the ridge RID of the fingerprint F and the amount of the light reflected from the valley VAL of the fingerprint F may be different. Accordingly, the ridge RID portion and the valley VAL portion of the fingerprint F may be detected based on a difference in the amount of the reflected light, such as the light incident on the light sensing portion RA of the optical sensor PS. Since the optical sensors PS output electrical signals according to the differences in the light (e.g., photocurrent), the pattern of the fingerprint F of the finger may be identified.

The first and second lights L1 and L2 outputted from the emission portion EMA and reflected from the fingerprint F may be outputted as a fingerprint sensing signal for identifying the pattern of the fingerprint F of the finger. In an embodiment, when the first touch insulating pattern 215 or the first touch pattern 221 is formed at the first reverse taper angle AN1, a first light L1 incident at an angle greater than or equal to the first reverse taper angle AN1 may directly reach the light sensing portion RA. In addition, a second light L2 incident at an angle less than or equal to the first reverse taper angle AN1 may be reflected by the second touch pattern 222. Accordingly, the reflected light may reach the light sensing portion RA. Accordingly, the light sensing portion RA may detect the light incident through the opening of the first touch pattern 221 and the light incident after being reflected by the second touch pattern to identify the fingerprint F.

In summary, the light sensing portion RA may accurately identify the fingerprint F by detecting the light incident through the opening of the first touch pattern 221 and the light incident after being reflected by the second touch pattern 222.

FIGS. 17 to 20 are cross-sectional views illustrating a method of manufacturing a touch pattern according to embodiments of the present disclosure. Hereinafter, a method of manufacturing a touch pattern will be described with reference to FIGS. 17 to 20.

Figure 17:
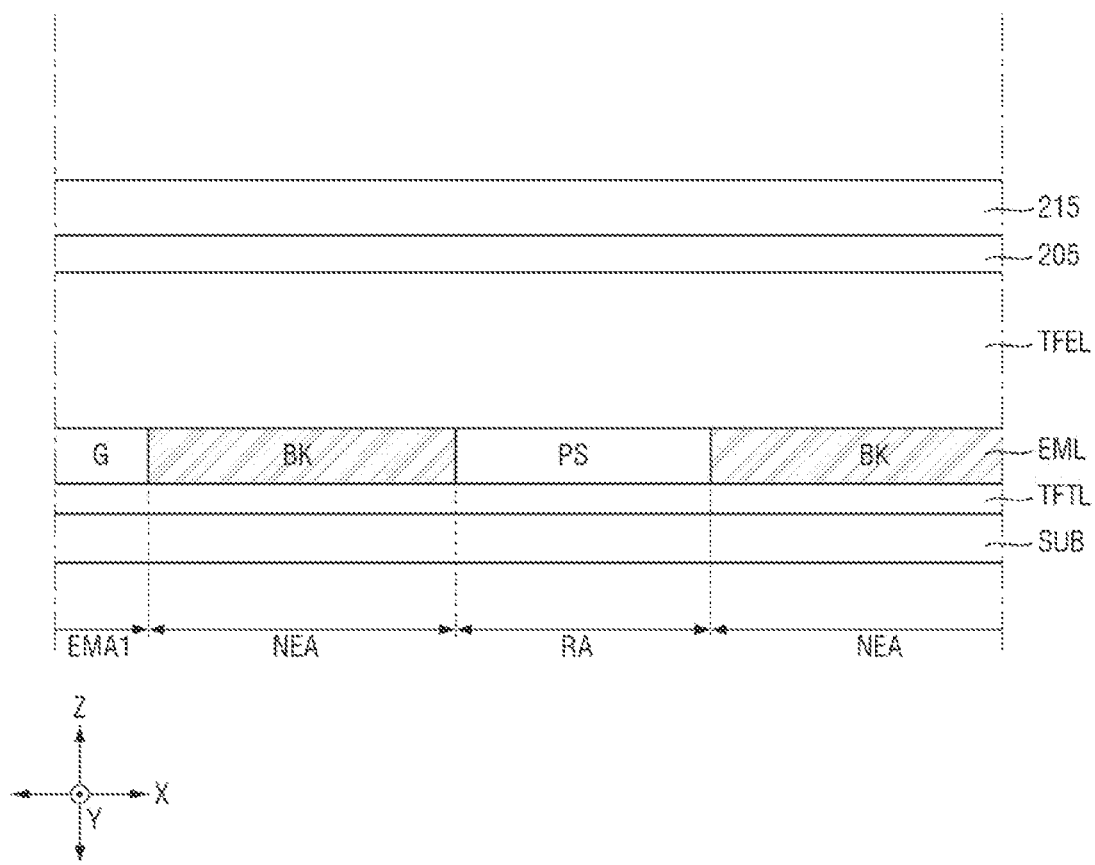
FIGS. 17 to 20 are cross-sectional views illustrating a method of manufacturing a touch pattern according to embodiments of the present disclosure.

First, referring to FIG. 17, the base layer 205 is formed on (e.g., formed directly thereon in the third direction Z) the encapsulation layer TFEL and the first touch insulating pattern 215 is formed on (e.g., formed directly thereon in the third direction Z) the base layer 205. In an embodiment, the first touch insulating pattern 215 may have a stacked structure including one or more layers.

Figure 18:
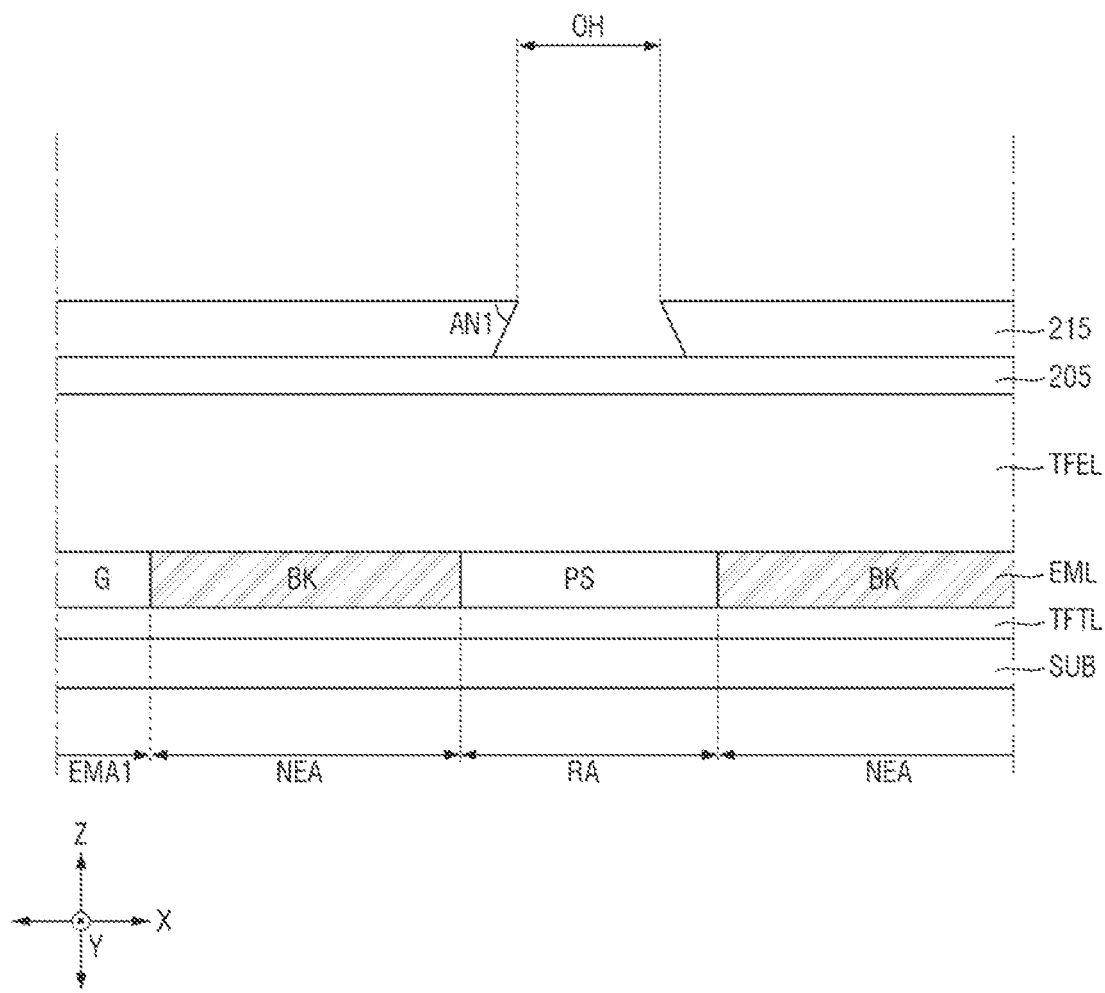

Subsequently, referring to FIG. 18, the first touch insulating pattern 215 may be etched in a reverse tapered shape. In an embodiment, the first touch insulating pattern 215 may be etched using a mask pattern as an etching mask. However, embodiments of the present disclosure are not necessarily limited thereto.

In an embodiment, a step of forming the mask pattern may include a step of forming a photosensitive material layer on the first touch insulating pattern 215, a step of partially irradiating light to the photosensitive material layer using a mask, and a step of developing the mask pattern by applying a developer.

The photosensitive material layer may include a material that responds to light. For example, in an embodiment the photosensitive material layer may include a negative photosensitive material to etch the first touch insulating pattern 215 in a reverse tapered shape. In the negative photosensitive material, a polymer may be at least partially cured and insolubilized in an exposed portion to which light is irradiated through an opening of the mask, and the exposed portion may be removed by the developer. In this embodiment, the remaining photosensitive material pattern may have a shape corresponding to a light blocking pattern of the mask.

Accordingly, the first touch insulating pattern 215 may have a reverse tapered shape having the first reverse taper angle AN1.

Figure 19:
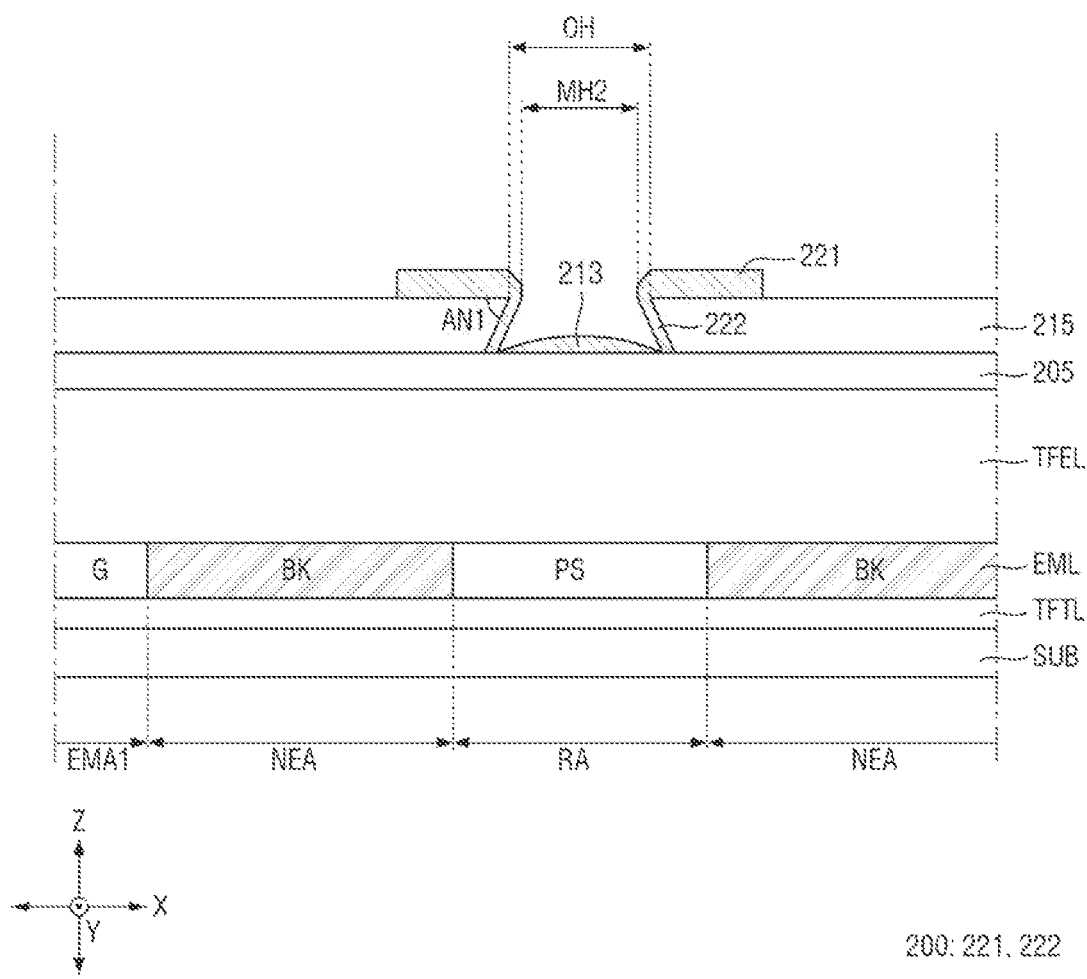

Next, referring to FIG. 19, the touch pattern 220 may be formed on (e.g., formed directly thereon) the first touch insulating pattern 215. A method of forming the touch pattern is not particularly limited. For example, in an embodiment, a deposition method such as vacuum deposition or sputtering may be used. The sputtering process may be DC sputtering using a DC voltage source.

The sputtering process may be performed under an inert gas atmosphere. For example, the process may be carried out under an argon atmosphere that does not contain oxygen. An atomic ratio in the touch pattern 220 may be precisely controlled by using the sputtering process. For example, the composition of a target material for sputtering and the composition of the touch pattern 220 formed after sputtering may be substantially the same. For example, by performing sputtering using a material having a desired composition, the composition of the touch pattern 220 may be precisely controlled.

Figure 20:
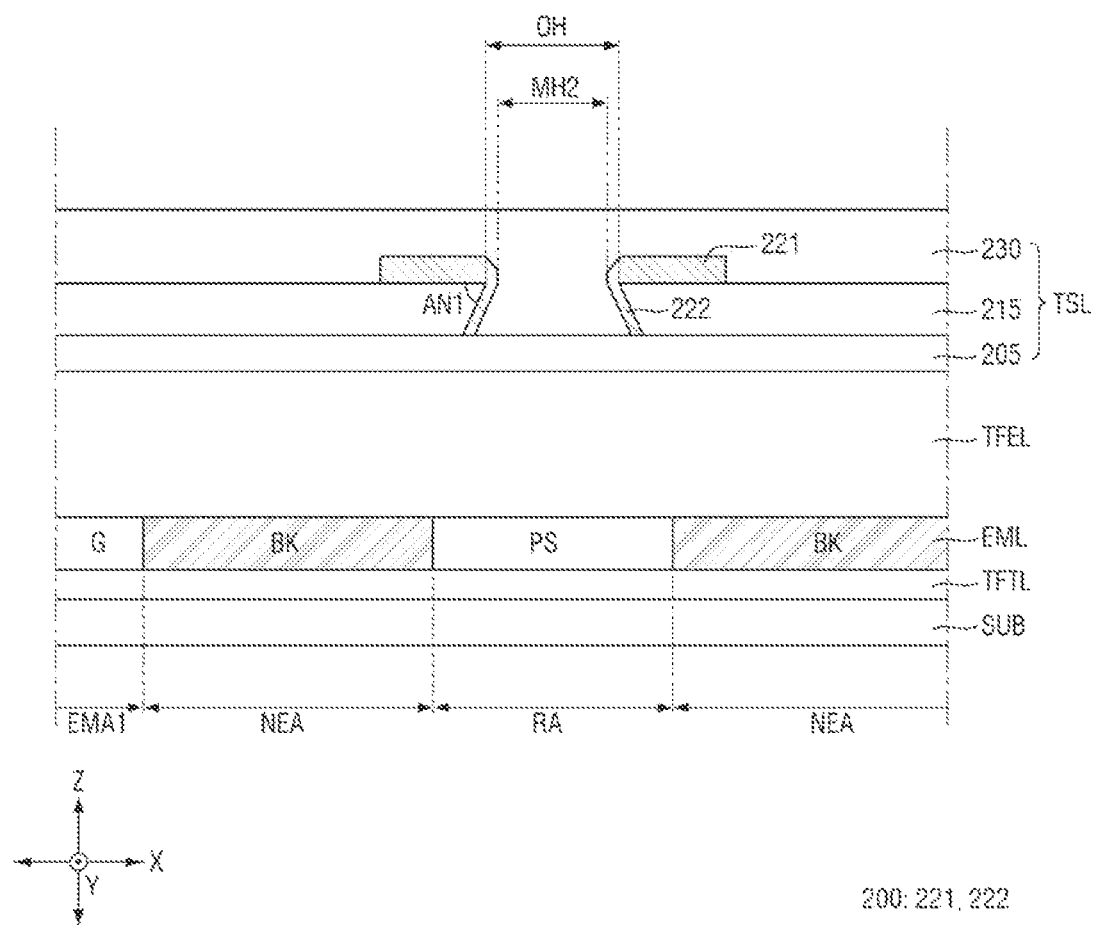

Referring to FIG. 20, a third touch pattern 213 formed on the base layer 205 may be etched. In an embodiment, the third touch pattern 213 may be etched using a mask pattern as an etching mask.

In an embodiment, a step of etching the third touch pattern 213 may be a step of patterning the second touch pattern 222 using a wet etching process.

Compared to dry etching, wet etching has an advantage in that the process is simple and the etching uniformity is excellent. For example, the step of etching the third touch pattern may include a step of applying an etchant. The etchant may be reactive to the third touch pattern 213. In an embodiment, the etchant may contain about 10.0 wt % to about 20.0 wt % of peroxysulfate (persulfate), about 0.1 wt % to about 5.0 wt % of an organic acid or a salt thereof, about 0.1 wt % to about 1.5 wt % of a fluorine compound, about 0.01 wt % to about 2.0 wt % of a cyclic amine compound, and the remaining amount of water. However, embodiments of the present disclosure are not necessarily limited thereto, and the etchant may be a material capable of reacting with the third touch pattern 213.

In the process of etching the third touch pattern 213, a portion of the second touch pattern 220 may also be etched. In the above-described embodiment, the second touch pattern may be disposed to cover a portion of the side surface of the first touch insulating pattern 215, or the second touch pattern 222 may be disposed to be spaced apart from the first touch pattern 221. Since a description thereof has been made above, a redundant description will be omitted for economy of description.

Through this, the first touch pattern 220 and the second touch pattern 222 may be formed. Since the specific shape, arrangement, and physical properties of the first touch pattern and the second touch pattern 222 have been described above, a redundant description thereof will be omitted for economy of description.

Even in an embodiment shown in FIG. 20, the area of the light incident on the light sensing portion RA may be reduced by the touch pattern 220 of the touch sensing layer TSL, and the light incident towards the light sensing portion RA may be reflected by the touch pattern 220. For example, the touch pattern 220 may detect the light incident on the light sensing portion RA to accurately identify the user's fingerprint.

In concluding the detailed description, those skilled in the art will appreciate that many variations and modifications can be made to the described embodiments without substantially departing from the principles of the present disclosure. Therefore, the described embodiments of the present disclosure are used in a generic and descriptive sense only and not for purposes of limitation.

What is claimed is:

1. A display device comprising:
a substrate;
a plurality of emission portions disposed on the substrate, the plurality of emission portions emitting light;
a plurality of light sensing portions disposed on the substrate, the plurality of light sensing portions sensing an incident light;
a bank layer partitioning the plurality of emission portions and the plurality of light sensing portions; and
a touch sensing layer disposed on the bank layer;
wherein the touch sensing layer comprises:
a first touch insulating pattern disposed on the bank layer, the first touch insulating pattern partitioning a light opening overlapping the plurality of light sensing portions; and
a touch electrode disposed on the first touch insulating pattern,
wherein a cross-sectional shape of the first touch insulating pattern has a reverse tapered shape having a width that decreases in a direction towards a top surface of the substrate.

2. The display device of claim 1, wherein the touch electrode comprises:
a first touch pattern disposed on a top surface of the first touch insulating pattern; and
a second touch pattern disposed on a side surface of the first touch insulating pattern.

3. The display device of claim 2, wherein the first touch pattern protrudes from the side surface of the first touch insulating pattern towards a central portion of the light opening.

4. The display device of claim 2, wherein the second touch pattern directly contacts the side surface of the first touch insulating pattern.

5. The display device of claim 2, wherein the second touch pattern covers an entirety of the side surface of the first touch insulating pattern.

6. The display device of claim 2, wherein the first touch pattern comprises a mesh pattern.

7. The display device of claim 1, wherein:
the first touch insulating pattern comprises a first reverse tapered surface adjacent to the light opening; and
an inclination angle of the first reverse tapered surface is in a range of about 65 degrees to about 90 degrees.

8. The display device of claim 1, wherein a first distance between the touch electrode and a center of an adjacent light sensing portion of the plurality of light sensing portions in one direction is less than a second distance between the touch electrode and a center of a first emission portion among the plurality of emission portions in the one direction, the first emission portion is adjacent to the touch electrode.

9. The display device of claim 8, wherein a width of the adjacent light sensing portion in the one direction is greater than the first distance.

10. The display device of claim 9, wherein a ratio of the width of the adjacent light sensing portion to the first distance in the one direction is in a range of about 1.8 to about 2.

11. The display device of claim 8, wherein the first emission portion and the light sensing portion are repeatedly arranged with each other along the one direction.

12. The display device of claim 1, further comprising:
a light emitting layer disposed on each of the plurality of emission portions, on the substrate;
a photoelectric conversion layer disposed on each of the plurality of light sensing portions, on the substrate; and
a common electrode disposed on the light emitting layer and the photoelectric conversion layer.

13. The display device of claim 12, wherein a cross-sectional shape of the light opening is a tapered shape having a width that increases in a direction towards a top surface of the substrate.

14. A display device comprising:
a substrate;
a plurality of emission portions disposed on the substrate, the plurality of emission portions emitting light;
a plurality of light sensing portions disposed on the substrate, the plurality of light sensing portions sensing an incident light;
a bank layer partitioning the plurality of emission portions and the plurality of light sensing portions; and
a touch sensing layer disposed on the bank layer,
wherein the touch sensing layer comprises:
a first touch insulating pattern disposed on the bank layer, the first touch insulating pattern partitioning a light opening overlapping the light sensing portion;
a first touch pattern disposed on a top surface of a first touch insulating pattern; and
a second touch pattern disposed on a side surface of the first touch insulating pattern,
wherein an opening width of the second touch pattern increases in a direction towards a top surface of the substrate.

15. The display device of claim 14, wherein an angle between the top surface of the first touch insulating pattern and the side surface of the first touch insulating pattern is an acute angle.

16. The display device of claim 14, wherein the second touch pattern covers an entirety of the side surface of the first touch insulating pattern.

17. The display device of claim 14, wherein the first touch pattern comprises a mesh pattern.

18. The display device of claim 14, wherein a first distance between the first touch pattern and an adjacent light sensing portion of the plurality of light sensing portions in one direction is less than a second distance between the first touch pattern and a first emission portion among the plurality of emission portions in the one direction, the first emission portion is adjacent to the first touch pattern.

19. The display device of claim 18, wherein a width of the adjacent light sensing portion in the one direction is greater than the first distance.

20. The display device of claim 19, wherein a ratio of the width of the adjacent light sensing portion to the first distance in the one direction is in a range of about 1.8 to about 2.

* * * * *